US009563508B2

(12) United States Patent
Lin et al.

(10) Patent No.: US 9,563,508 B2
(45) Date of Patent: Feb. 7, 2017

(54) MEMORY MANAGEMENT METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Yu-Cheng Hsu, Yilan County (TW); An-Cheng Liu, Taipei (TW); Siu-Tung Lam, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 12 days.

(21) Appl. No.: 14/693,885

(22) Filed: Apr. 23, 2015

(65) Prior Publication Data

US 2016/0232053 A1    Aug. 11, 2016

(30) Foreign Application Priority Data

Feb. 11, 2015    (TW) .............................. 104104527 A

(51) Int. Cl.
| | |
|---|---|
| *G11C 29/00* | (2006.01) |
| *G06F 11/10* | (2006.01) |
| *G11C 29/52* | (2006.01) |
| *G11C 5/14* | (2006.01) |
| *G11C 11/56* | (2006.01) |

(Continued)

(52) U.S. Cl.
CPC ......... *G06F 11/108* (2013.01); *G06F 11/1072* (2013.01); *G11C 5/148* (2013.01); *G11C 11/5628* (2013.01); *G11C 16/12* (2013.01);

*G11C 16/3459* (2013.01); *G11C 29/021* (2013.01); *G11C 29/028* (2013.01); *G11C 29/42* (2013.01); *G11C 29/52* (2013.01);
(Continued)

(58) Field of Classification Search
CPC .... G06F 11/108; G06F 11/1072; G11C 29/52; G11C 29/50004; G11C 2029/5004
See application file for complete search history.

(56) References Cited

U.S. PATENT DOCUMENTS

| | | | |
|---|---|---|---|
| 7,483,297 B2 | 1/2009 | Mori et al. | |
| 7,817,480 B2 | 10/2010 | Kozakai et al. | |

(Continued)

FOREIGN PATENT DOCUMENTS

TW    I467379    1/2015

*Primary Examiner* — April Y Blair
*Assistant Examiner* — Thien D Nguyen
(74) *Attorney, Agent, or Firm* — Jianq Chyun IP Office

(57) ABSTRACT

The present disclosure provides a memory management method for a rewritable non-volatile memory module. The rewritable non-volatile memory module includes physical programming units, each of which includes multiple bits. The memory management method includes: identifying a first physical programming unit by applying a predetermined read voltage, where the first physical programming unit is identified as in a fully-erased status; identifying a second and a third physical programming units which are programmed before the first physical programming unit; acquiring status data of the second and the third physical programming unit; computing a difference of the status data between the second and the third physical programming unit; if the difference is larger than a threshold, identifying the second physical programming unit as in a program failure status.

24 Claims, 20 Drawing Sheets

(51) Int. Cl.
  *G11C 16/12* (2006.01)
  *G11C 16/34* (2006.01)
  *G11C 29/02* (2006.01)
  *G11C 29/42* (2006.01)
  *G11C 29/04* (2006.01)

(52) U.S. Cl.
  CPC ............... *G11C 2029/0409* (2013.01); *G11C 2029/0411* (2013.01)

(56) References Cited

U.S. PATENT DOCUMENTS

| | | | |
|---|---|---|---|
| 2011/0138222 A1* | 6/2011 | Haines | G06F 11/1048 714/6.12 |
| 2011/0194348 A1* | 8/2011 | Mokhlesi | G11C 11/5642 365/185.03 |
| 2011/0258495 A1* | 10/2011 | Tseng | G11C 16/3418 714/704 |
| 2011/0302445 A1* | 12/2011 | Byom | G06F 12/123 714/6.1 |
| 2012/0166740 A1* | 6/2012 | Tan | G06F 12/0246 711/154 |
| 2016/0041891 A1* | 2/2016 | Malshe | G06F 11/2094 714/704 |

* cited by examiner

MEMORY MANAGEMENT METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 104104527, filed on Feb. 11, 2015. The entirety of the above-mentioned patent application is hereby incorporated by reference herein and made a part of this specification.

BACKGROUND

1. Technology Field

The present invention is directed to a memory management method and more particularly, to a memory management method and a memory control circuit unit and a memory storage apparatus using the method, which can accurately detect a page being programmed when an abnormal power failure occurs.

2. Description of Related Art

Along with the widespread of digital cameras, cell phones, and MP3 players in recently years, the consumers' demand to storage media has increased drastically. Because a rewritable non-volatile memory is capable of providing features such as data non-volatility, low power consumption, small volume, and non-mechanical structure, high reading and writing speed, the rewritable non-volatile memory has become the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

Referring to FIG. 1, a flash memory device 1 includes a charge-trapping layer 2 for storing electrons, a control gate 3 for applying a voltage, a tunnel oxide layer 4, and an interpoly dielectric layer 5. When data is to be written into the flash memory device 1, a threshold voltage of the flash memory device 1 may be changed by injecting electrons into the charge-trapping layer 2. Accordingly, a digital-level state of the flash memory device 1 is defined to implement a function of storing data. Here, the process of injecting the electrons to the charge-trapping layer 2 is referred to as a programming process. By contrast, when the stored data is to be removed, the injected electrons are removed from the charge-trapping layer 2, and thereby the flash memory device 1 is restored back to the default state before programming.

During the operation of a memory storage apparatus, if an abnormal power failure occurs, data being written when the abnormal power failure occurs may have errors and should be considered as invalid data. In a conventional determination method, all pages in the memory storage apparatus are scanned when the memory storage apparatus is powered on, and if the number of error bits in a page is over a threshold, the memory storage apparatus determines the data stored in the page as invalid data. However, an issue that valid data having a great number of error bits caused by other reasons (e.g., data retention, reading interference and durability for erasing and writing) is determined as the invalid data may occur in this method, which may lead to serious errors during the operation of the memory storage apparatus. Therefore, how to accurately determine the page being written when the abnormal power failure has become one of the major subjects for technicians of the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a memory management method and a memory control circuit unit and a memory storage apparatus using the method, which can accurately detect a page being programmed when an abnormal power failure occurs and identify data of the page as invalid data.

According to an embodiment of the present invention, a memory management method for a rewritable non-volatile memory module is provided. The rewritable non-volatile memory module has a plurality of physical programming units, and each of the physical programming units includes a plurality of bits. The memory management method includes identifying a first physical programming unit among the physical programming units by applying a predetermined read voltage, wherein the first physical programming unit is identified as in a fully-erased status. The memory management method further includes identifying a second physical programming unit and at least one third physical programming unit, wherein the second physical programming unit is programmed before the first physical programming unit, and the at least one third physical programming unit is programmed before the second physical programming unit. The memory management method further includes acquiring status data of the second physical programming unit and at least one status data of the at least one third physical programming unit. The memory management method further includes computing a difference between the status data of the second physical programming unit and the at least one status data of the at least one third physical programming unit. The memory management method further includes, if the difference is greater than a threshold, identifying the second physical programming unit as in a program failure status.

According to an embodiment of the present invention, a memory control circuit unit for accessing a rewritable non-volatile memory module is provided. The memory control circuit unit includes a host interface, a memory interface and a memory management circuit. The host interface is coupled to the host system. The memory interface is coupled to the rewritable non-volatile memory module, wherein the rewritable non-volatile memory module has a plurality of physical programming units, and each of the physical programming units includes a plurality of bits. The memory management circuit is coupled to the host interface and the memory interface. The memory management circuit identifies a first physical programming unit among the physical programming units by applying a predetermined read voltage, wherein the first physical programming unit is identified as in a fully-erased status. The memory management circuit identifies a second physical programming unit and at least one third physical programming unit, wherein the second physical programming unit is programmed before the first physical programming unit, and the at least one third physical programming unit is programmed before the second physical programming unit. The memory management circuit acquires status data of the second physical programming unit and at least one status data of the at least one third physical programming unit. The memory management circuit computes a difference between the status data of the second physical programming unit and the at least one status data of the at least one third physical programming unit. And, if the difference is greater than a threshold, the memory management circuit identifies the second physical programming unit as in a program failure status.

According to an embodiment of the present invention, a memory storage apparatus including a connection interface unit, a rewritable non-volatile memory module and a memory control circuit unit is provided. The connection interface unit is coupled to the host system. The rewritable non-volatile memory module has a plurality of physical programming units, and each of the physical programming units includes a plurality of bits. The memory control circuit unit is coupled to the connection interface unit and the rewritable non-volatile memory module. The memory control circuit unit identifies a first physical programming unit among the physical programming units by applying a predetermined read voltage, wherein the first physical programming unit is identified as in a fully-erased status. The memory control circuit unit identifies a second physical programming unit and at least one third physical programming unit, wherein the second physical programming unit is programmed before the first physical programming unit, and the at least one third physical programming unit is programmed before the second physical programming unit. The memory control circuit unit acquires status data of the second physical programming unit and at least one status data of the at least one third physical programming unit. The memory control circuit unit computes a difference between the status data of the second physical programming unit and the at least one status data of the at least one third physical programming unit. And, if the difference is greater than a threshold, the memory control circuit unit identifies the second physical programming unit as in a program failure status.

To sum up, in the memory management method and the memory control circuit unit and the memory storage apparatus using the method provided by the exemplary embodiments of the present invention, status data of the last programmed physical programming unit and status data other physical programming units are compared, so as to determine whether the program failure occurs in the last programmed physical programming unit when the power failure occurs in the memory storage apparatus.

In order to make the aforementioned and other features and advantages of the invention more comprehensible, several embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
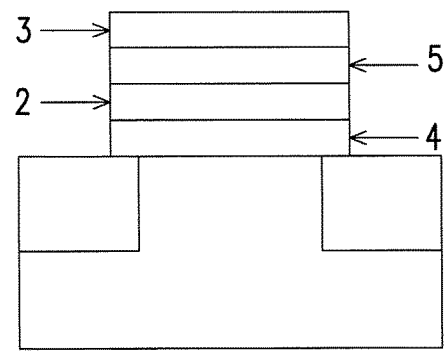
FIG. 1 is a schematic diagram illustrating a flash memory device according to the related art.

Reference will now be made in detail to the present embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage apparatus (i.e., a memory storage system) typically includes a rewritable non-volatile memory module and a controller (i.e., a memory control circuit unit). The memory storage apparatus is usually used together with a host system, such that the host system can write data into or read data from the memory storage apparatus.

Figure 2:
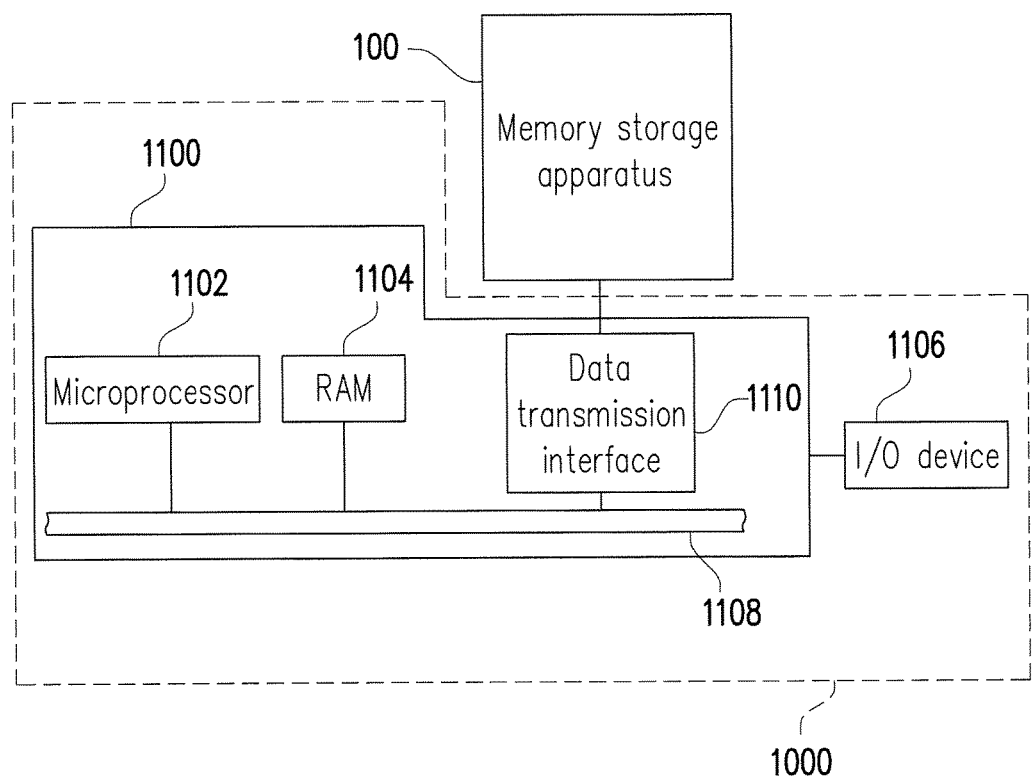
FIG. 2 illustrates a host system and a memory storage apparatus according to an exemplary embodiment.

FIG. 2 illustrates a host system and a memory storage apparatus according to an exemplary embodiment.

Figure 3:
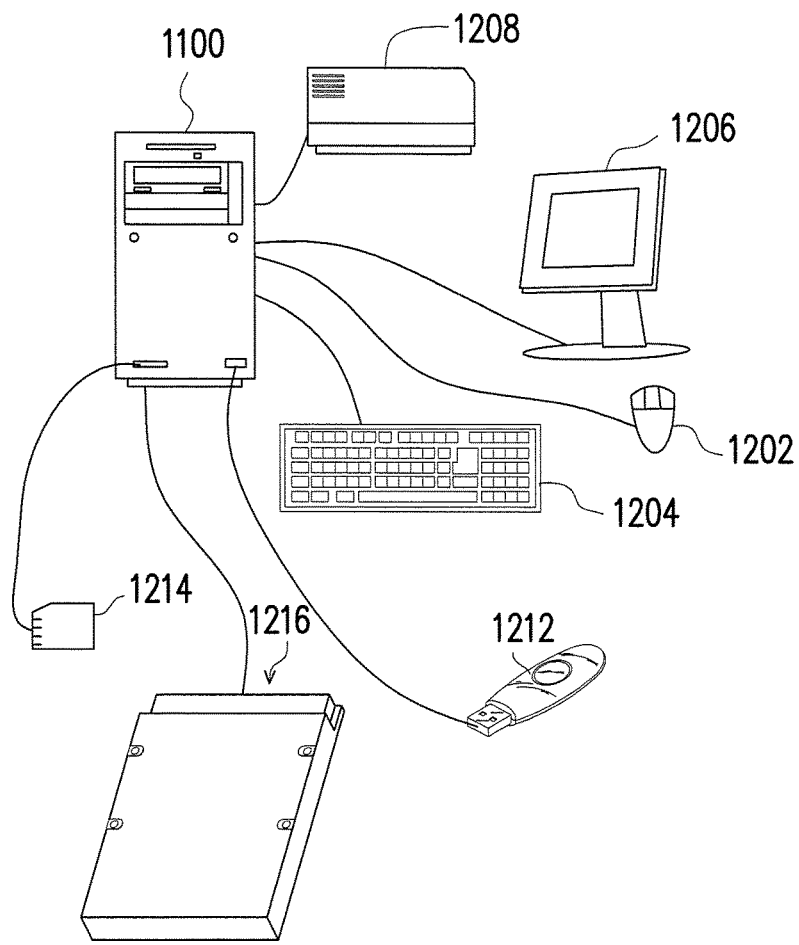
FIG. 3 schematically illustrates a computer, an input/output (I/O) device, and a memory storage apparatus according to an exemplary embodiment.

Referring to FIG. 2, a host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 3. It should be understood that, the devices depicted in FIG. 3 should not be construed as limitations to the present invention, and the I/O device 1106 may include other devices as well.

In the exemplary embodiment of the present invention, the memory storage apparatus 100 is coupled to other devices of the host system 1000 through the data transmission interface 1110. With the operations of the microprocessor 1102, the RAM 1104, and the I/O device 1106, data can be written into or read from the memory storage apparatus 100. For instance, the memory storage apparatus 100 may be a rewritable non-volatile memory storage apparatus, such as a flash drive 1212, a memory card 1214, or a solid state drive (SSD) 1216 as shown in FIG. 3.

Figure 4:
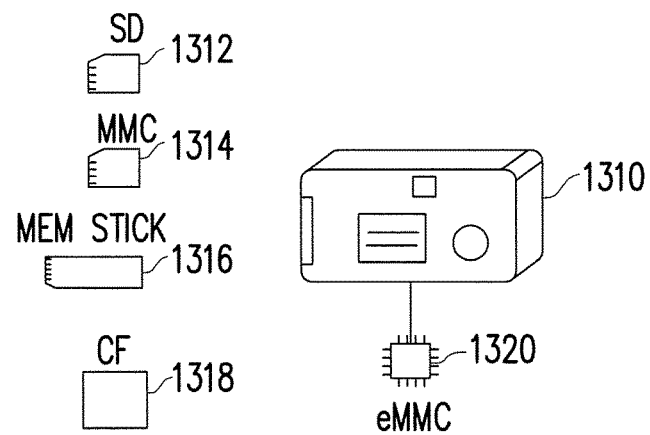
FIG. 4 illustrates a host system and a memory storage apparatus according to an exemplary embodiment.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318 or an embedded storage apparatus 1320 (as shown in FIG. 4). The embedded storage device 1320 includes an embedded MMC (eMMC). It should be noted that the eMMC is directly coupled to a substrate of the host system.

Figure 5:
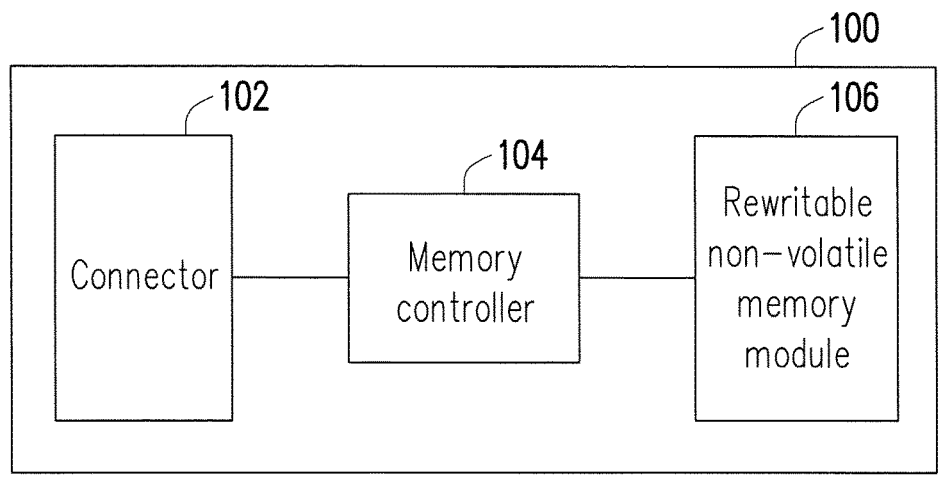
FIG. 5 is a schematic block diagram illustrating a memory storage apparatus according to an exemplary embodiment.

FIG. 5 is a schematic block diagram illustrating a memory storage apparatus according to an exemplary embodiment.

Referring to FIG. 5, the memory storage apparatus 100 includes a connector 102, a memory control circuit unit 104, and a rewritable non-volatile memory module 106.

In the present exemplary embodiment, the connection interface unit 102 complies with the universal serial bus (USB) standard. However, it should be understood that the present invention is not limited thereto, and the connection interface unit 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the serial advanced technology attachment (SATA) standard, the ultra high speed-I (UHS-I) interface standard, the ultra high speed-II (UHS-II) interface standard, the memory stick (MS) interface standard, the multi media card (MMC) interface standard, the eMMC interface standard, the universal flash storage (UFS) interface standard, the compact flash (CF) standard, the integrated device electronics (IDE) standard, or other suitable standards. In the present exemplary embodiment, the connection interface unit 102 may be packaged with the memory control circuit unit 104 in a chip or disposed outside of a chip including the memory control circuit unit.

The memory control circuit unit 104 is configured to execute a plurality of logic gates or control commands which are implemented in a hardware form or in a firmware form and perform the operations such as data writing, reading or erasing in the rewritable non-volatile memory module 106 according to the command of the host system 1000.

The rewritable non-volatile memory module 106 is coupled to the memory control circuit unit 104 and configured to store the data written by the host system 1000. The rewritable non-volatile memory module 106 may be a multi level cell (MLC) NAND flash memory module (i.e., a memory cell can store 2 bits of data), a trinary level cell (TLC) NAND flash memory module (i.e., a memory cell can store 3 bits of data), other flash memory module or other memory module having the same characteristic.

Figure 6:
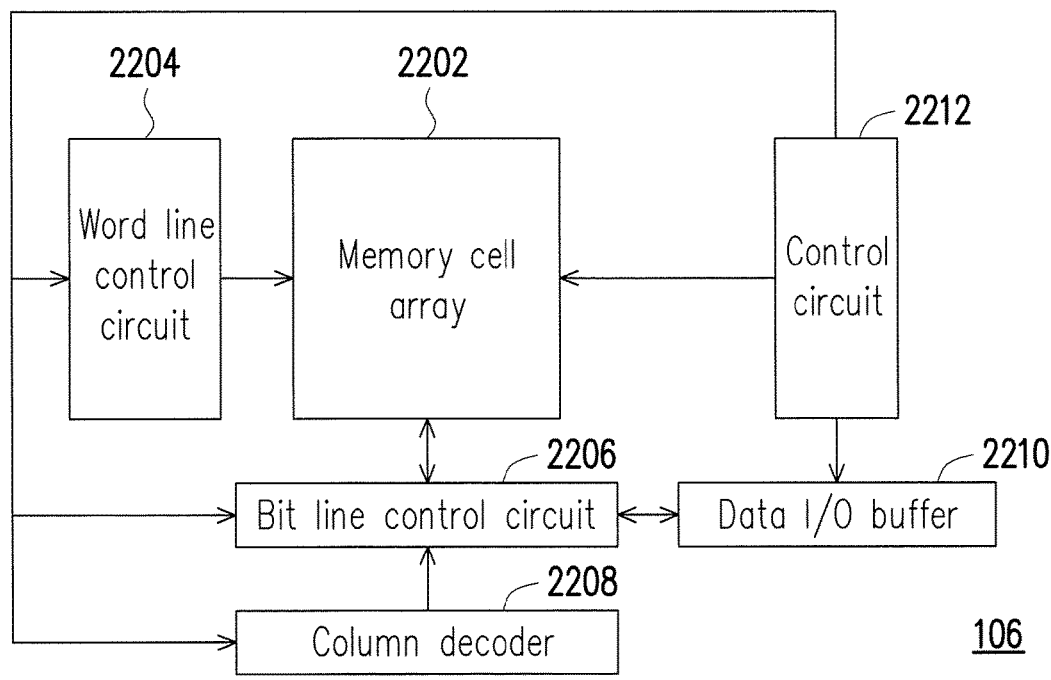
FIG. 6 is a schematic block diagram of a rewritable non-volatile memory module according to an exemplary embodiment.

FIG. 6 is a schematic block diagram of a rewritable non-volatile memory module according to an exemplary embodiment.

Referring to FIG. 6, the rewritable non-volatile memory module 106 includes a memory cell array 2202, a word line control circuit 2204, a bit line control circuit 2206, a column decoder 2208, a data input/output (I/O) buffer 2210 and a control circuit 2212.

Figure 7:
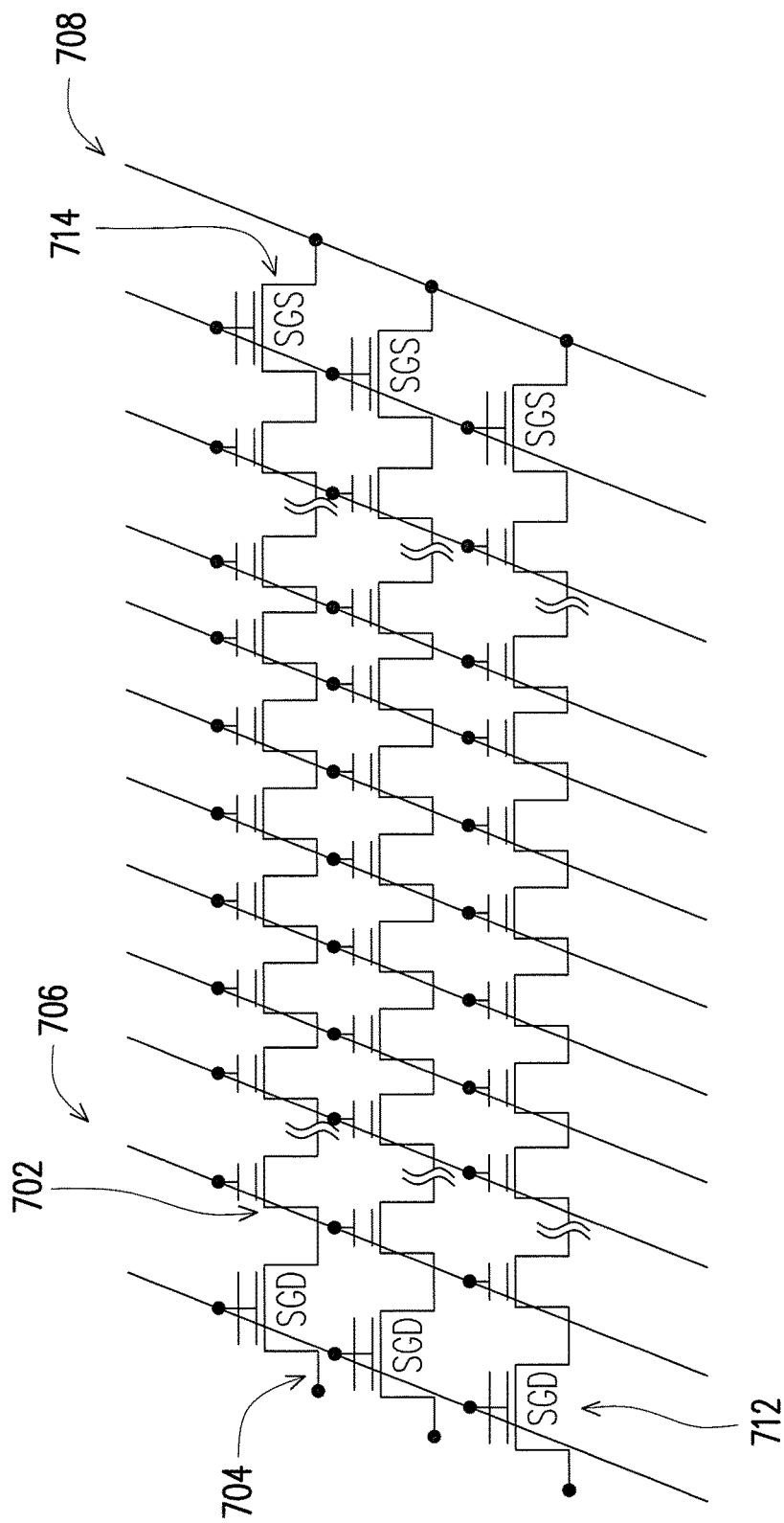
FIG. 7 is a schematic diagram illustrating a memory cell array according to an exemplary embodiment.

The memory cell array 2202 includes a plurality of memory cells 702 for storing data, a plurality of select gate drain (SGD) transistors 712, a plurality of select gate source (SGS) transistors 714, a plurality of bit lines 704 connected with the memory cells, a plurality of word lines 706, and a common source line 708 (as shown in FIG. 7). The memory cells 702 are disposed on the cross points of the bit lines 704 and the word lines 706 in an array. When a write command or a read command is received from the memory control circuit unit 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 is configured to control the voltage applied to the word lines 706, the bit line control circuit 2206 is configured to control the voltage applied to the bit lines 704, the column decoder 2208 selects the corresponding bit line according to the decoding column address in the command, and the data I/O buffer 2210 is configured to store the data temporarily.

The memory cells in the rewritable non-volatile memory module 106 employ a plurality of gate voltages for representing multi-bit data. To be specific, each memory cell of the memory cell array 2202 has a plurality of states, and the states are distinguished by a plurality of read voltages.

Figure 8:
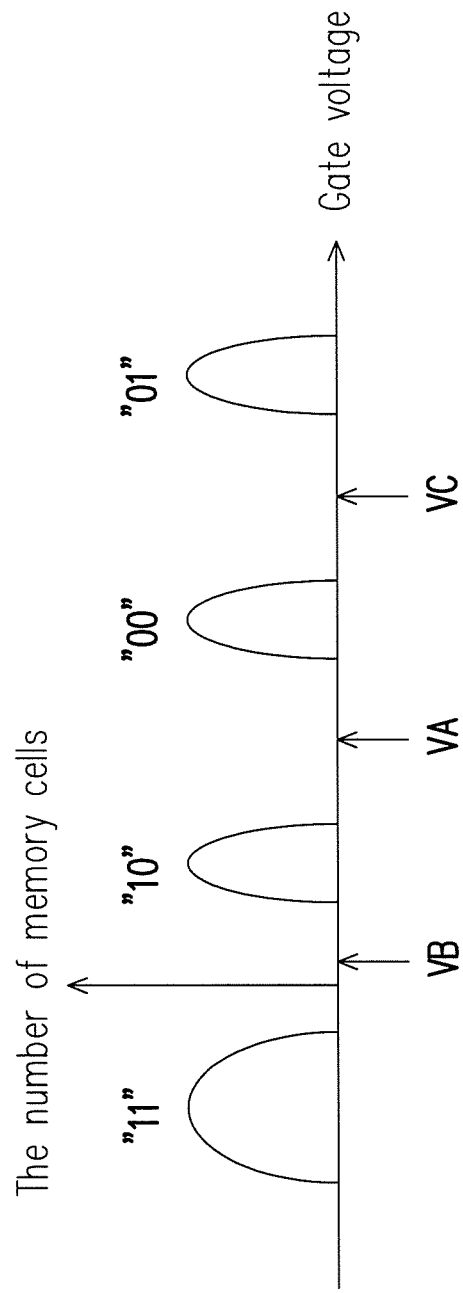
FIG. 8 is a statistical distribution diagram illustrating gate voltages corresponding to data stored in a memory array according to an exemplary embodiment.

FIG. 8 is a statistical distribution diagram illustrating gate voltages corresponding to data stored in a memory array according to an exemplary embodiment.

Referring to FIG. 8, taking an MLC NAND flash memory for example, the gate voltages in each memory cell may be categorized into 4 storage states according to a first read voltage VA, a second read voltage VB and a third read voltage VC, and these storage states respectively represent "11," "10," "00," and "01." In other words, each storage state includes the least significant bit (LSB) and the most significant bit (MSB). In the present exemplary embodiment, the first bit from the left of the storage states (i.e., "11," "10," "00," and "01") is the LSB, and the second bit from the left of the storage states is the MSB. Therefore, in an exemplary embodiment, each memory cell stores 2 bits of data. It should be understood that the gate voltages and the corresponding storage states illustrated in FIG. 8 are only examples. In another exemplary embodiment of the present invention, the gate voltages and the corresponding storage states may also be arranged as "11," "10," "01," and "00" along with the increase in the gate voltages. Alternatively, the storage states corresponding to the gate voltages may also be values obtained by mapping or inverting actual storage values. Besides, in another exemplary embodiment, the first bit from the left may be defined as the MSB, and the second bit from the left may be defined as the LSB.

In a case where each memory cell stores 2 bits of data, the memory cells on the same word line constitute a storage space of 2 physical programming units (i.e., a lower physical programming unit and an upper physical programming unit). Namely, the LSB of each memory cell corresponds to the lower physical programming unit, and the MSB of each memory cell corresponds to the upper physical programming unit. In addition, several physical programming units in the memory cell array 2202 constitute a physical block, and the physical block is the smallest unit for performing the erasing operation. That is to say, each of the physical blocks has the least number of memory cells for being erased altogether.

To write (or to program) data to a memory cell of the memory cell array 2202, a voltage (e.g., a gate voltage) applied to a certain terminal in the memory cell is controlled to change the electron volume in a charge-trapping layer in the gate, so that the conduction state of the channel of the memory cell is changed to present a different storage state. For instance, when the data of the lower page (or the lower physical programming unit) is 1, and the data of the upper page (or the upper physical programming unit) is 1, the control circuit 2212 controls the word line control circuit 2204 not to change the gate voltage in the memory cell and keep the storage state of the memory cell as "11." When the data of the lower page is 1, and the data of the upper page is 0, the word line control circuit 2204 is controlled by the control circuit 2212 to change the gate voltage in the memory cell, so as to change the storage state of the memory cell to "10." When the data of the lower page is 0, and the data of the upper page is 0, the word line control circuit 2204 is controlled by the control circuit 2212 to change the gate voltage in the memory cell, so as to change the storage state of the memory cell to "00." And, when the data of the lower page is 0, and the data of the upper page is 1, the word line control circuit 2204 is controlled by the control circuit 2212 to change the gate voltage in the memory cell, so as to change the storage state of the memory cell to "01."

Figure 9:
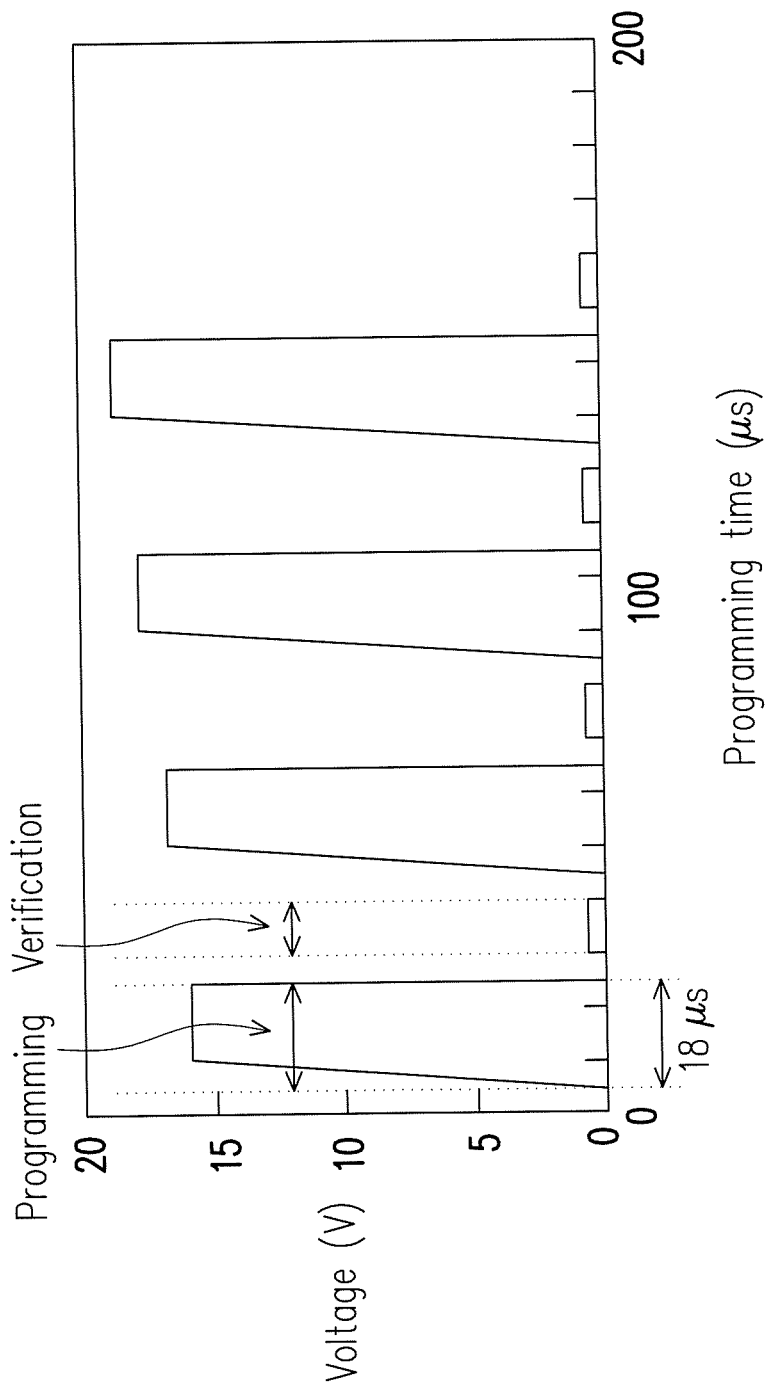
FIG. 9 is a schematic diagram of programming a memory cell according to an exemplary embodiment.

FIG. 9 is a schematic diagram of programming a memory cell according to an exemplary embodiment.

Referring to FIG. 9, in the present exemplary embodiment, the memory cell is programmed through applying a pulse writing/threshold voltage verifying method. Particularly, when data is to be written into a memory cell, the memory control circuit unit 104 sets an initial write voltage and a write voltage pulse time and instructs the control circuit 2212 of the rewritable non-volatile memory module 106 to program the memory cell according to the set initial write voltage and write voltage pulse time to write the data. The memory control circuit unit 104 then verifies the memory cell by means of a verification voltage, so as to determine whether the memory cell is in the correct storage state. If the memory cell is not programmed to the correct storage state, the memory control circuit unit 104 instructs the control circuit 2212 to re-program the memory cell according to a new write voltage (also referred to as a repetitive writing voltage) obtained by adding an incremental-step-pulse programming (ISPP) adjustment value to the initial writing voltage. By contrast, if the programmed memory cell is already programmed to the correct storage state, it indicates that the data is correctly written into the memory cell. For instance, the initial writing voltage may be set as 16 V, the write voltage pulse time may be set as 18 microseconds (μs), and the ISPP adjustment value may be set as 0.6V, but the present invention is not limited thereto.

Figure 10:
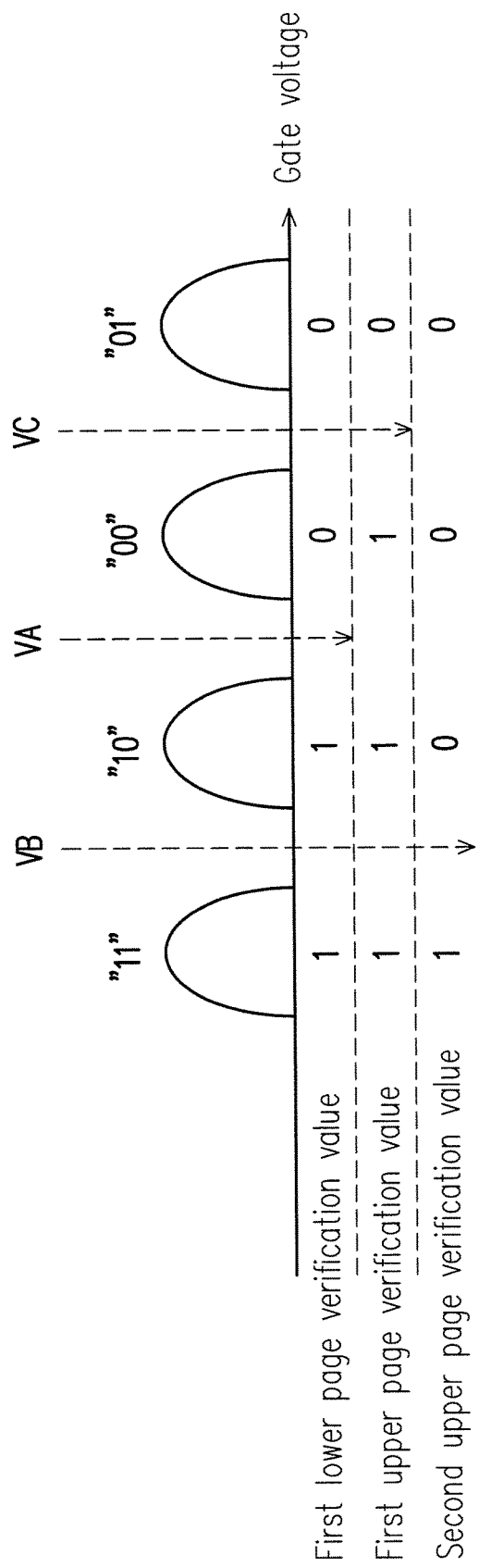
FIG. 10 is a schematic diagram of reading data from a memory cell according to an exemplary embodiment.

FIG. 10 is a schematic diagram of reading data from a memory cell according to an exemplary embodiment, in which an MLC NAND flash memory is taken as an example.

Referring to FIG. 10, in a reading operation of a memory cell of the memory cell array 2202, the data stored in the memory cell is identified based on a conduction state of a channel of the memory cell (i.e., a path for the memory cell to be electrically connected with a bit line and a source line, such as a path between a source and a drain in the memory cell) after a read voltage is applied to a control gate of the memory cell. In an operation for reading data from a lower page, the word line control circuit 2204 applies the first read voltage VA as the read voltage to the memory cell and determines the value of data of the lower page according to whether the channel of the memory cell is conducted and the corresponding expression (1):

$$\text{LSB}=(VA)\text{Lower\_pre1} \tag{1}$$

Therein, (VA)Lower_pre1 represents a first lower page verification value obtained by applying the first read voltage VA.

For instance, when the first read voltage VA is lower than the gate voltage in the memory cell, the channel of the memory cell is not conducted, and a first lower page verification value, which is '0', is output. Accordingly, the LSB is identified as in a first state as 0. For instance, when the first read voltage VA is higher than the gate voltage in the memory cell, the channel of the memory cell is conducted, and the first lower page verification value, which is '1', is output. Accordingly, the LSB is identified as in a second state. Here, the first state is identified as "0," and the second state is identified as "1." That is, the gate voltage for presenting the LSB as "1" and the gate voltage for presenting the LSB as "0" may be distinguished by the first read voltage VA.

In an operation for reading data from an upper page, the word line control circuit 2204 respectively applies the second read voltage VB and the third read voltage VC as the read voltages to the memory cell and determines the value of data of the upper page according to whether the channel of the memory cell is conducted and the corresponding expression (2):

$$\text{MSB}=((VB)\text{Upper\_pre2})\text{xor}(\sim(VC)\text{Upper\_pre1}) \tag{2}$$

Therein, (VC)Upper_pre1 represents a first upper page verification value obtained by applying the third read voltage VC, and (VB)Upper_pre2 represents a second upper page verification value obtained by applying the second read voltage VB, where the symbol "~" represents inversion.

Additionally, in the present exemplary embodiment, when the third read voltage VC is lower than the gate voltage in the memory cell, the channel of the memory cell is not conducted, and the first upper page verification value ((VC) Upper_pre1), which is '0', is output. When the second read voltage VB is lower than the gate voltage in the memory cell, the channel of the memory cell is not conducted, and the second upper page verification value ((VB)Upper_pre2), which is '0', is output.

Thus, according to the expression (2), it is assumed that the third read voltage VC and the second read voltage VB are both lower than the gate voltage in the memory cell. When the third read voltage VC is applied, the channel of the memory cell is not conducted, and the first upper page verification value, which is '0', is output; and when the second read voltage VB is applied, the channel of the memory cell is not conducted, and the second upper page verification value, which is '0', is output. At this time, the MSB is identified as in the second state, i.e., "1."

For instance, it is assumed that the third read voltage VC is higher than the gate voltage of the memory cell, and the second read voltage VB is lower than the gate voltage of the memory cell. When the third threshold voltage VC is applied, the channel of the memory cell is conducted, and a first upper page verification value, which is '1', is output; and when the second read voltage VB is applied, the channel of the memory cell is not conducted, and the second upper page verification value, which is '0', is output. At this time, the MSB is identified as in the first state, i.e., "0."

For instance, it is assumed that the third read voltage VC and the second read voltage VB are both higher than the gate voltage of the memory cell. When the third read voltage VC is applied, the channel of the memory cell is conducted, and the first upper page verification value, which is '1', is output; and when the second read voltage VB is applied, the channel of the memory cell is conducted, and the second upper page verification value, which is '1', is output. At this time, the MSB is identified as in the second state, i.e., "1."

It should be understood that the MLC NAND flash memory is illustrated as an example herein. However, the present invention is not limited thereto, and data can be read from any other MLC NAND flash memory based on the principle described above.

Figure 11:
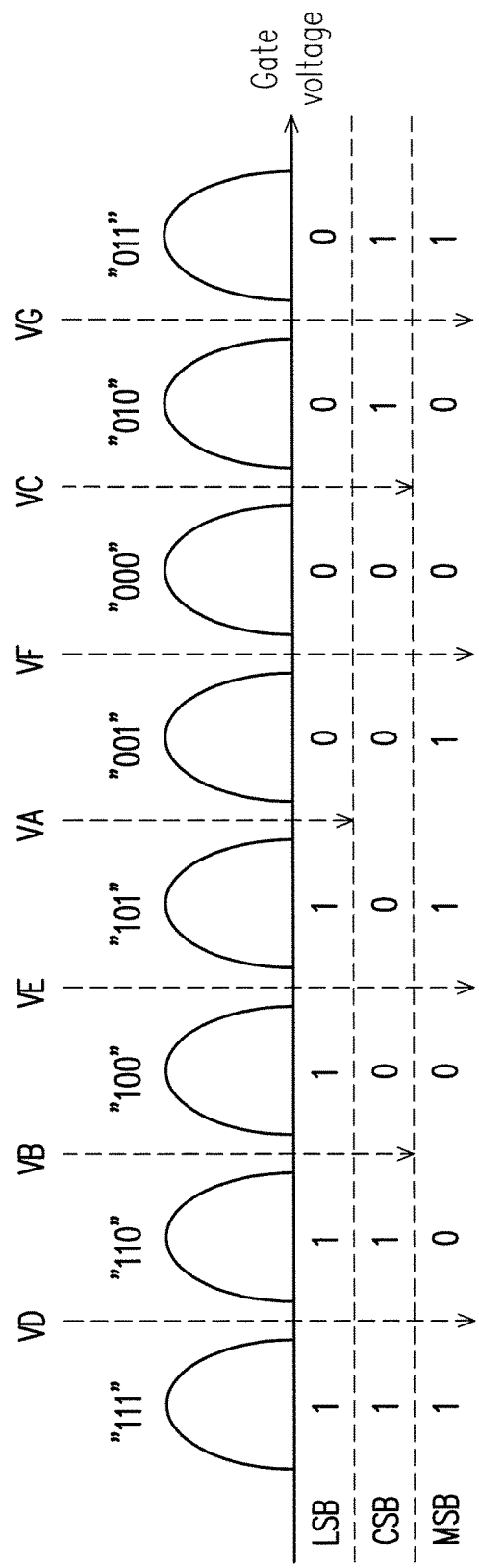
FIG. 11 is a schematic diagram of reading data from a memory cell according to another exemplary embodiment.

For instance, in an exemplary TLC NAND flash memory (as shown in FIG. 11), each storage state includes an LSB (the first bit from the left), a center significant bit (CSB, the second bit from the left), and an MSB (the third bit from the left), wherein the LSB corresponds to a lower page (or a lower physical programming unit), the CSB corresponds to a center page (or a center physical programming unit), and the MSB corresponds to an upper page (or an upper physical programming unit). In this example, the gate voltage in each memory cell may be distinguished into 8 storage states (i.e., "111," "110," "100," "101," "001," "000," "010" and "011") according to a first read voltage VA, a second read voltage VB, a third read voltage VC, a fourth read voltage VD, a fifth read voltage VE, a sixth read voltage VF and a seventh read voltage VG.

Figure 12:
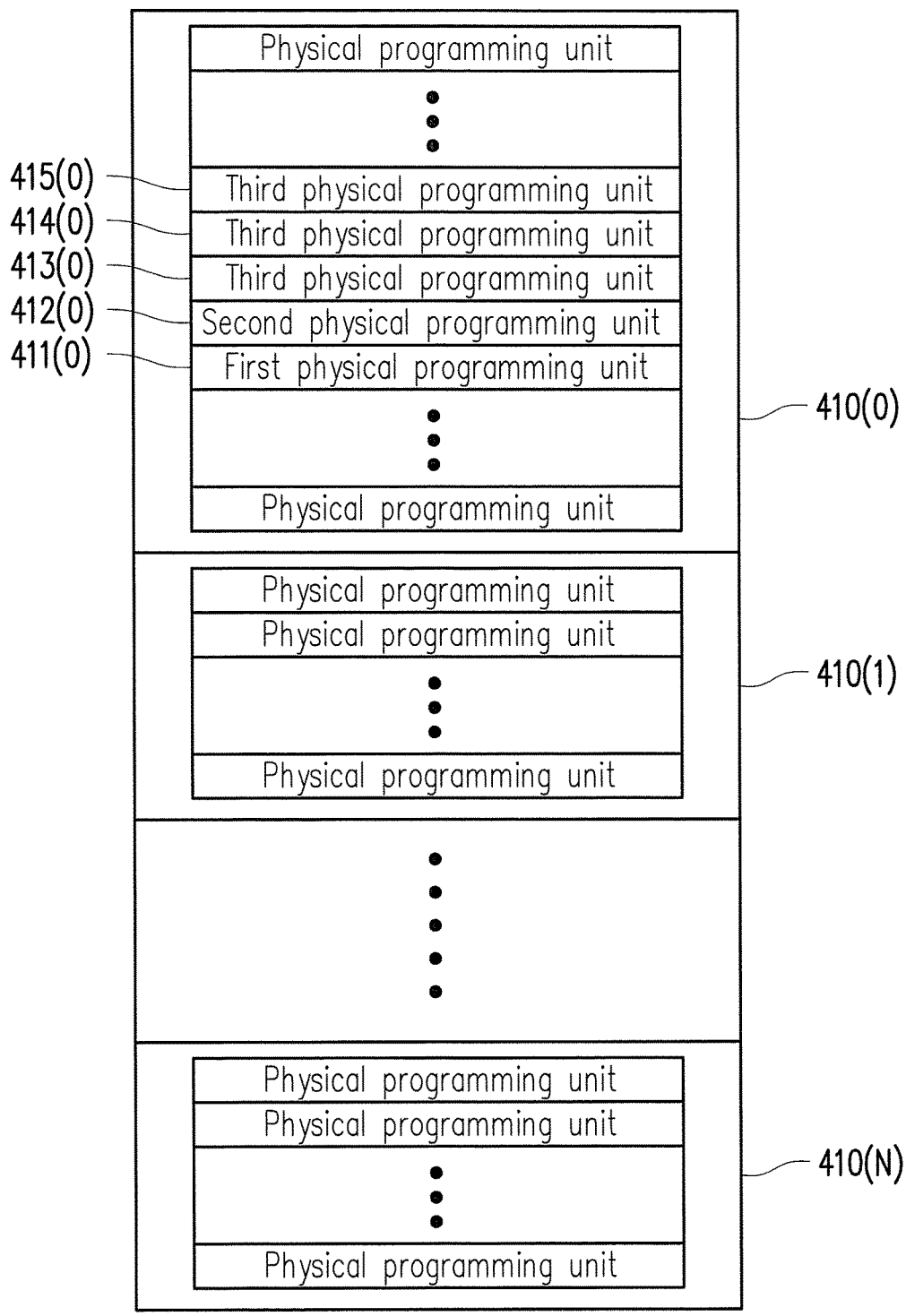
FIG. 12 is a schematic diagram of managing the rewritable non-volatile memory module according to an exemplary embodiment of the present invention.

FIG. 12 is a schematic diagram of managing the rewritable non-volatile memory module according to an exemplary embodiment of the present invention.

Referring to FIG. 12, the memory control circuit unit 104 writes data into the memory cells 702 of the rewritable non-volatile memory module 106 by using each physical programming unit as a unit, and erases data from the memory cells 702 of the rewritable non-volatile memory module 106 by using each physical block as a unit. To be specific, the memory cells 702 in the rewritable non-volatile memory module 106 constitute a plurality of a plurality of physical programming units, and the physical programming units constitute a plurality of physical blocks 410(0) to 410(N). Each physical block is the smallest unit for erasing data. Namely, each physical block contains the least number of memory cells to be erased altogether. Each physical programming unit is the smallest unit for programming data. Namely, a physical programming unit is the smallest unit for writing data. Each physical programming unit generally includes a data bit area and a redundant bit area. The data bit area includes a plurality of physical access address for storing user data, and the redundant bit area is used for storing system data (e.g., control information and error checking and correcting (ECC) codes). For instance, in an exemplary TLC NAND flash memory, the LSBs of the memory cells on the same word line constitute a lower physical programming unit; the CSBs of the memory cells on the same word line constitute a center physical programming unit; and the MSBs of the memory cells on the same word line constitute an upper physical programming unit.

Figure 13:
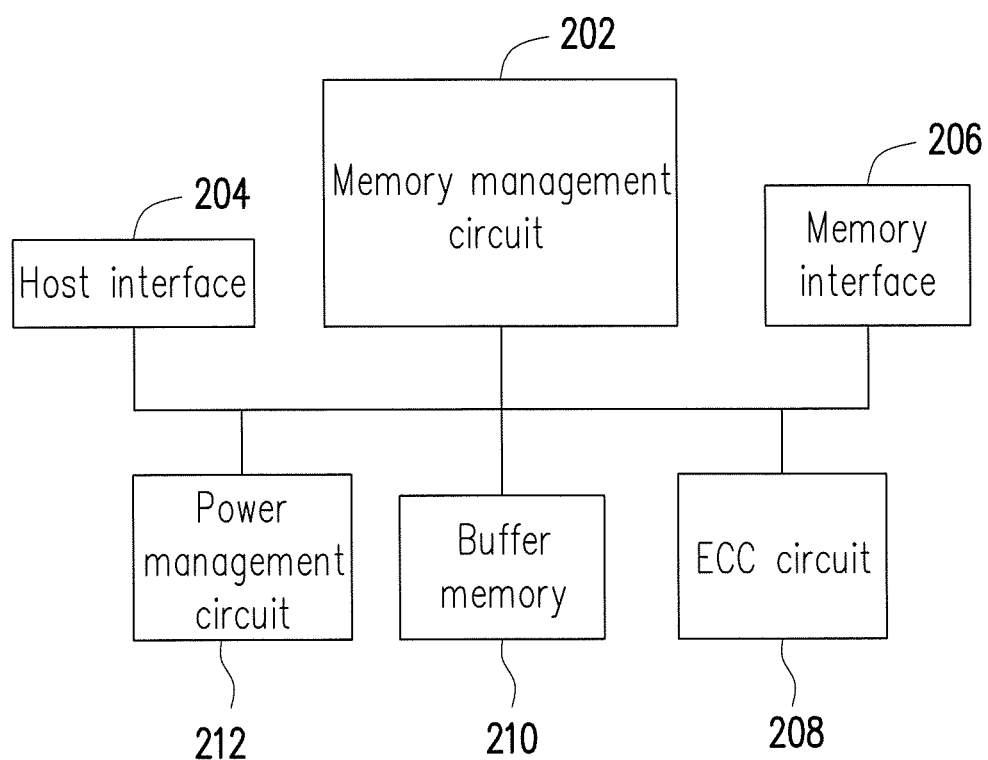
FIG. 13 is a schematic block diagram illustrating a memory control circuit according to an exemplary embodiment.

Referring to FIG. 13, the memory control circuit unit 104 includes a memory management circuit 202, a host interface 204, a memory interface 206 and an error checking and correcting circuit 208.

The memory managing circuit 202 is configured to control the whole operation of the memory control circuit unit 104. To be specific, the memory management circuit 202 has a plurality of control instructions, and when the memory storage apparatus 100 is in operation, the control instructions are executed to perform a data writing operation, a data reading operation, a data erasing operation, and so on.

In the present exemplary embodiment, the control instructions of the memory management circuit 202 are implemented in a firmware form. For example, the memory management circuit 202 includes a microprocessor unit (not shown) and a read-only memory (ROM, not shown), and the control instructions are burnt in the read-only memory. When the memory storage apparatus 100 is operated, the control instructions are executed by the microprocessor unit to write, read, and erase data.

In another exemplary embodiment of the present invention, the control instructions of the memory management circuit 202 may also be stored in a specific block (e.g., a system area in the memory module exclusively used for storing system data) of the rewritable non-volatile memory module 106 as a programming code. Moreover, the memory management circuit 202 includes a microprocessor unit (not shown), a read-only memory (ROM, not shown) and a random access memory (not shown). In particular, the ROM has boot codes, and when the memory controller 104 is enabled, the microprocessor unit first executes the boot codes to load the control instructions from the rewritable non-volatile memory module 106 into the RAM of the memory management circuit 202. The microprocessor unit then executes the control instructions for data writing, reading and erasing.

Furthermore, as in another exemplary embodiment, the control instructions of the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical blocks of the rewritable non-volatile memory module 106. The memory writing circuit is configured to issue a write command to the rewritable non-volatile memory module 106 to write data thereto. The memory reading circuit is configured to issue a read command to the rewritable non-volatile memory module 106 to read data therefrom. The memory erasing circuit is configured to issue an erase command to the rewritable non-volatile memory module 106 to erase data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify command and data transmitted by the host system 1000. Namely, the commands and the data transmitted by the host system 1000 are transmitted to the memory management circuit 202 through the host interface 204. In the present exemplary embodiment, the host interface 204 complies with the USB standard. However, it should be understood that the present invention is not limited thereto, and the host interface 204 may comply with the PATA standard, the IEEE 1394 standard, the PCI express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

The error checking and correcting circuit 208 is coupled to the memory management circuit 202 and configured to perform an error checking and correcting (ECC) procedure to ensure the accuracy of data. To be specific, when the memory management circuit 202 reads data from the rewritable non-volatile memory module 10, the error checking and correcting circuit 208 executes the ECC procedure on the read data. For example, in the exemplary embodiment, the error checking and correcting circuit 208 is a low density parity check (LDPC) circuit and stores a log likelihood ratio (LLR) value table. When the memory management circuit 202 reads data from the rewritable non-volatile memory module 106, the error checking and correcting circuit 208 executes the ECC procedure according to the read data and a corresponding LLR value in the LLR value table. It should be understood that the error checking and correcting circuit 208 may be a turbo code circuit or any other circuit for performing an error correcting algorithm in another exemplary embodiment.

In an exemplary embodiment of the present invention, the memory control circuit unit 104 further includes a buffer memory 210 and a power management circuit 212.

The buffer memory 210 is coupled to the memory management circuit 202 and configured to temporarily store data and commands from the host system 1000 or data from the rewritable non-volatile memory module 106.

The power management circuit 212 is coupled to the memory management circuit 202 and configured to control the power of the memory storage apparatus 100.

Figure 14:
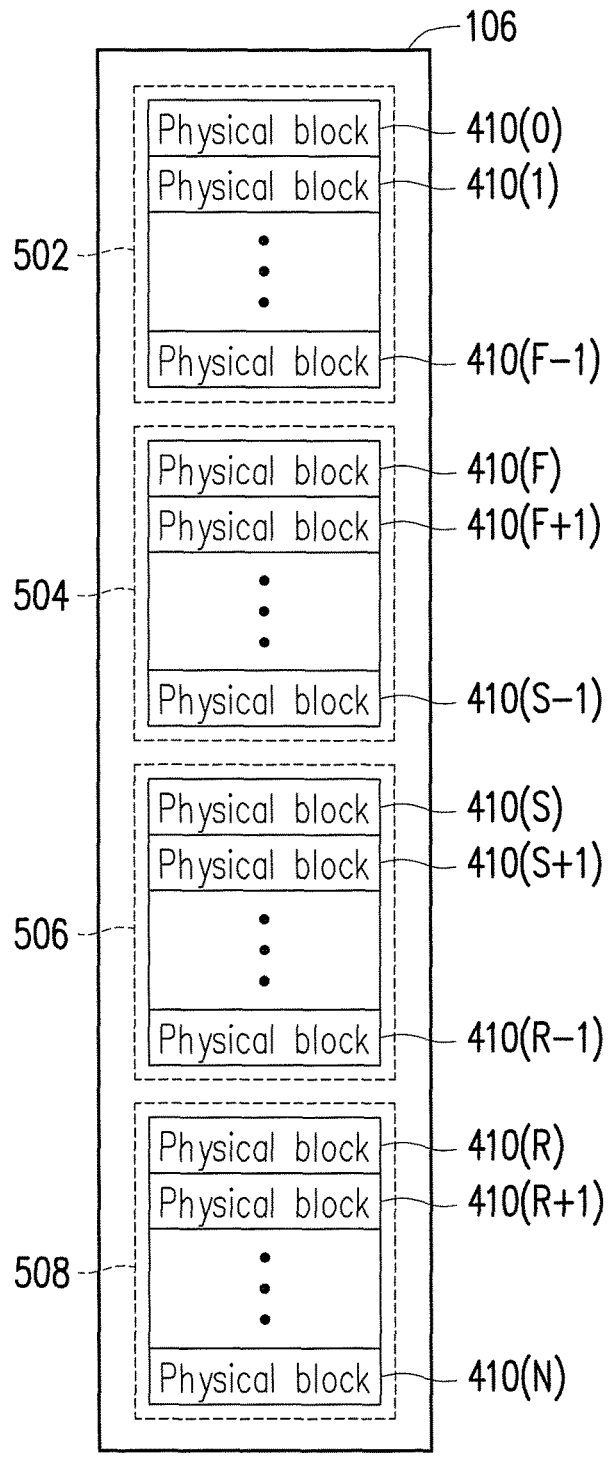
FIG. 14 and FIG. 15 are exemplary diagrams of managing physical erasing units according to an exemplary embodiment.
Figure 15:
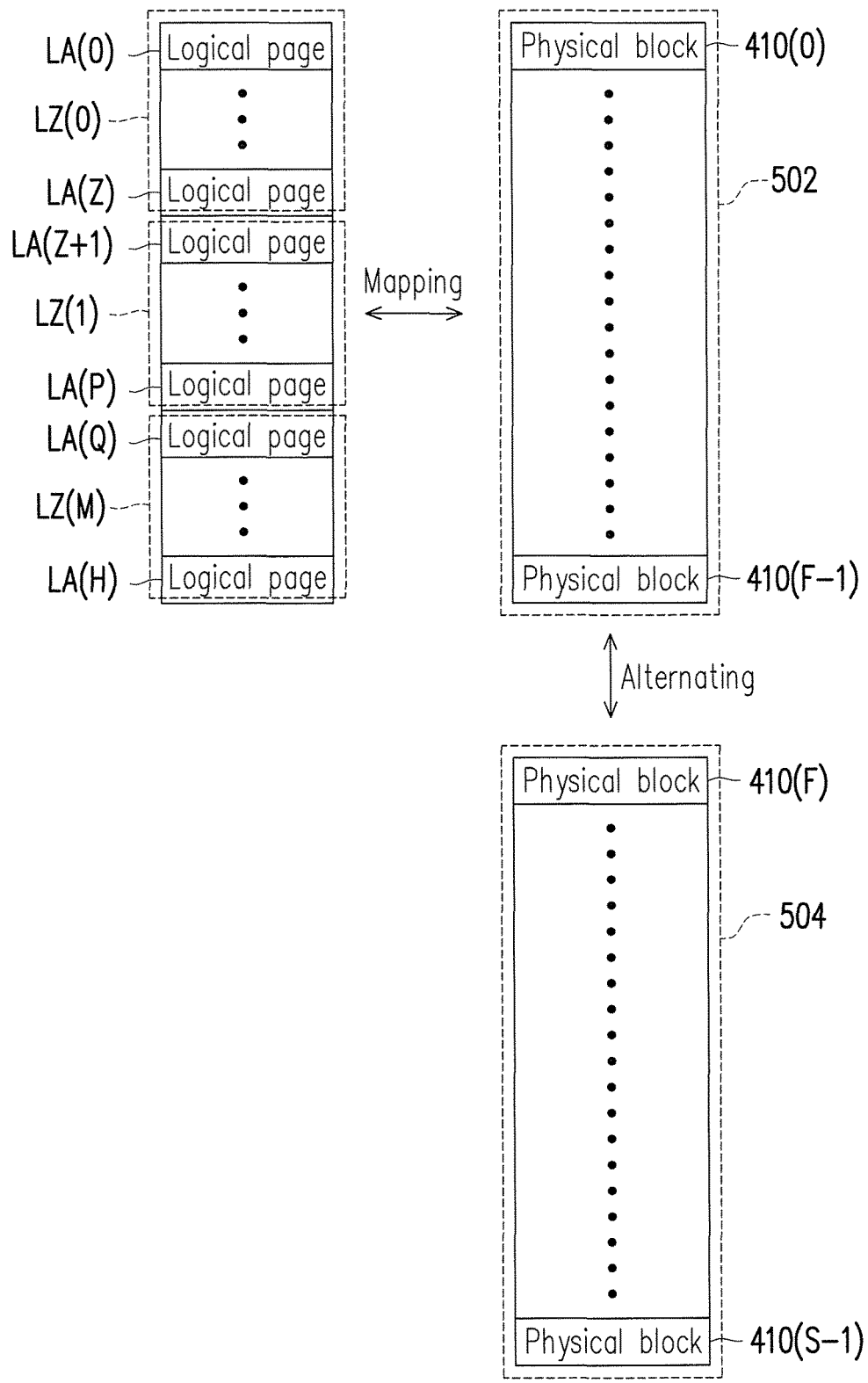

FIG. 14 and FIG. 15 are exemplary diagrams of managing physical erasing units according to an exemplary embodiment.

Referring to FIG. 14, in an exemplary embodiment of the present invention, the memory control circuit unit 104 (or the memory management circuit 202) may logically groups the physical blocks 410(0) to 410(N) into a data area 502, a spare area 504, a system area 506, and a replacement area 508.

The physical blocks logically belonging to the data area 502 and the spare area 504 are configured for storing data from the host system 1000. To be specific, the physical blocks of the data area 502 are considered as the physical blocks storing data, and the physical blocks of the spare area 504 are the physical blocks used for substituting the physical blocks of the data area 502. Namely, when a write command and data to be written are received from the host system 1000, the memory management circuit 202 selects a physical block from the spare area 504 and writes the data into the selected physical block for substituting the physical block of the data area 502.

The physical blocks logically belonging to the system area 506 are used for recording system data. For instance, the system data includes the manufacturer and model of the rewritable non-volatile memory module, the number of physical blocks in the rewritable non-volatile memory module and the number of physical programming units in each physical block.

The physical blocks logically belonging to the replacement area 508 are used in a bad physical block replacement procedure for replacing a damaged physical block. To be specific, if there are still normal physical blocks in the replacement area 508, and a physical block in the data area 502 is damaged, memory management circuit 202 the memory management circuit 202 selects a normal physical blocks from the replacement area 508 to replace the damaged physical block.

In particular, the numbers of the physical blocks in the data area 502, the spare area 504, the system area 506 and the replacement area 508 vary with different memory module standards. Additionally, it has to be understood that in the operation of the memory storage apparatus 100 the grouping relationships of associating the physical blocks to the data area, the spare area 504, the system area 506 and the replacement area 508 are dynamically changed. For example, when a physical block in the spare area 504 is damaged and then replaced by a physical block of the replacement area 508, the physical block in the replacement area 508 is associated to the spare area 504.

Referring to FIG. 15, the memory control circuit unit 104 (or the memory management circuit 202) may configure a plurality of logical pages LA(0) to LA(H) for mapping the physical programming units of the data area 502. Also, when the host system 1000 is to write data into a logical page or update data stored in a logical page, the memory control circuit unit 104 (or the memory management circuit 202) selects a physical block from the spare area 504 to write the data for substituting the physical block of the data area 502.

In order to recognize in which physical block the data of each logical page is stored, in the present exemplary embodiment, the memory control circuit unit 104 (or the memory management circuit 202) may record the mapping relation between the logical pages and the physical programming units. Also, when the host system 1000 is to access data from a logical page, the memory control circuit unit 104 (or the memory management circuit 202) may recognize a physical programming unit that this logical page is mapped to and access data from the physical programming unit. For example, in the exemplary embodiment, the memory control circuit unit 104 (or the memory management circuit 202) may store a logical-physical address mapping table in the rewritable non-volatile memory module 106 for recording the physical programming unit mapped to each logical page, and when being about to access the data, the memory control circuit unit 104 (or the memory management circuit 202) may load the logical-physical address mapping table into the buffer memory 208 for maintaining.

It should be mentioned that the buffer memory 208 may not be able to store the mapping tables recording the mapping relations of all logical pages due to its limited capacity. Therefore, in the present exemplary embodiment, the memory control circuit unit 104 (or the memory management circuit 202) groups the logical pages LA(0) to LA(H) into a plurality of logical zones LZ(0) to LZ(M) and allocates one logical-to-physical address mapping table to each logical zone. Particularly, if the memory control circuit unit 104 (or the memory management circuit 202) is intended to update the mapping relation of a certain logical unit, the logical-to-physical address mapping table corresponding to the logical zone of the logical unit is loaded to the buffer memory 208 and is then updated.

As mentioned above, the memory control circuit unit 104 (or the memory management circuit 202) writes data in a manner of one physical programming unit following another (which is referred to as a random writing mechanism hereinafter) in spite of which logical page the current data is written to. To be specific, the memory control circuit unit 104 (or the memory management circuit 202) selects a blank physical block from the spare area 504 to serve it as a currently used or active physical block for writing the data. Meanwhile, when the currently active physical erasing unit is full, the memory control circuit unit 104 (or the memory management circuit 202) selects another blank physical block to serve it as the currently active physical blocks to continuously write the random data corresponding to the write command from the host system 1000. Particularly, in order to prevent the physical blocks in the spare area 504 from being exhausted, when the number of the physical blocks in the spare area 504 is reduced down to a preset recycling threshold, the memory control circuit unit 104 (or the memory management circuit 202) performs a data merging process to make the data in at least one of the physical blocks in the data area 502 becoming invalid and then associates the physical blocks in the data area 502 in which the stored data becomes invalid back to the spare area 504. For instance, while performing the data merging process, the memory control circuit unit 104 (or the memory management circuit 202) may be required to use at least one blank physical block, and thus the recycling threshold may be set to be greater than the lowest threshold (i.e., 1).

In the present exemplary embodiment, every time when the memory storage apparatus 100 is powered on, the memory control circuit unit 104 (or the memory management circuit 202) identifies the last programmed physical programming unit in the active physical block and compares whether there is a certain degree of difference between status data of the last programmed physical programming units and status data of its former physical programming units and thereby, identifies whether a program failure occurs last time when the memory storage apparatus 100 is powered off.

To be specific, in the present exemplary embodiment, the memory control circuit unit 104 (or the memory management circuit 202) scans each physical programming unit in the active physical block, identifies a physical programming unit (referred to as a first physical programming unit hereinafter) in a fully-erased status for the first time and accordingly, identifies a previous physical programming unit (referred to as a second physical programming unit hereinafter) before the physical programming unit as the last programmed physical programming unit. Particularly, the memory control circuit unit 104 (or the memory management circuit 202) identifies threshold voltage distribution data of the memory cells in the second physical programming unit and threshold voltage distribution data of the memory cells in a previous physical programming unit (referred to as a third physical programming unit) of the second physical programming unit and then determines whether a difference between the threshold voltage distribution data of the memory cells in the second physical programming unit and the threshold voltage distribution data of the memory cells in the third physical programming unit is greater than a threshold. If the difference between the threshold voltage distribution data of the memory cells in the second physical programming unit and the threshold voltage distribution data of the memory cells in the third physical programming unit is greater than the threshold, the memory control circuit unit 104 (or the memory management circuit 202) identifies that the second physical programming unit has a program failure (i.e., the second physical programming unit is in a program failure status). If the difference between the threshold voltage distribution data of the memory cells in the second physical programming unit and the threshold voltage distribution data of the memory cells in the third physical programming unit is not greater than the threshold, and the number of error bits in the second physical programming unit is greater than an error bit threshold, the memory control circuit unit 104 (or the memory management circuit 202) corrects the error bits in the second physical programming unit through the ECC code.

Figure 16:
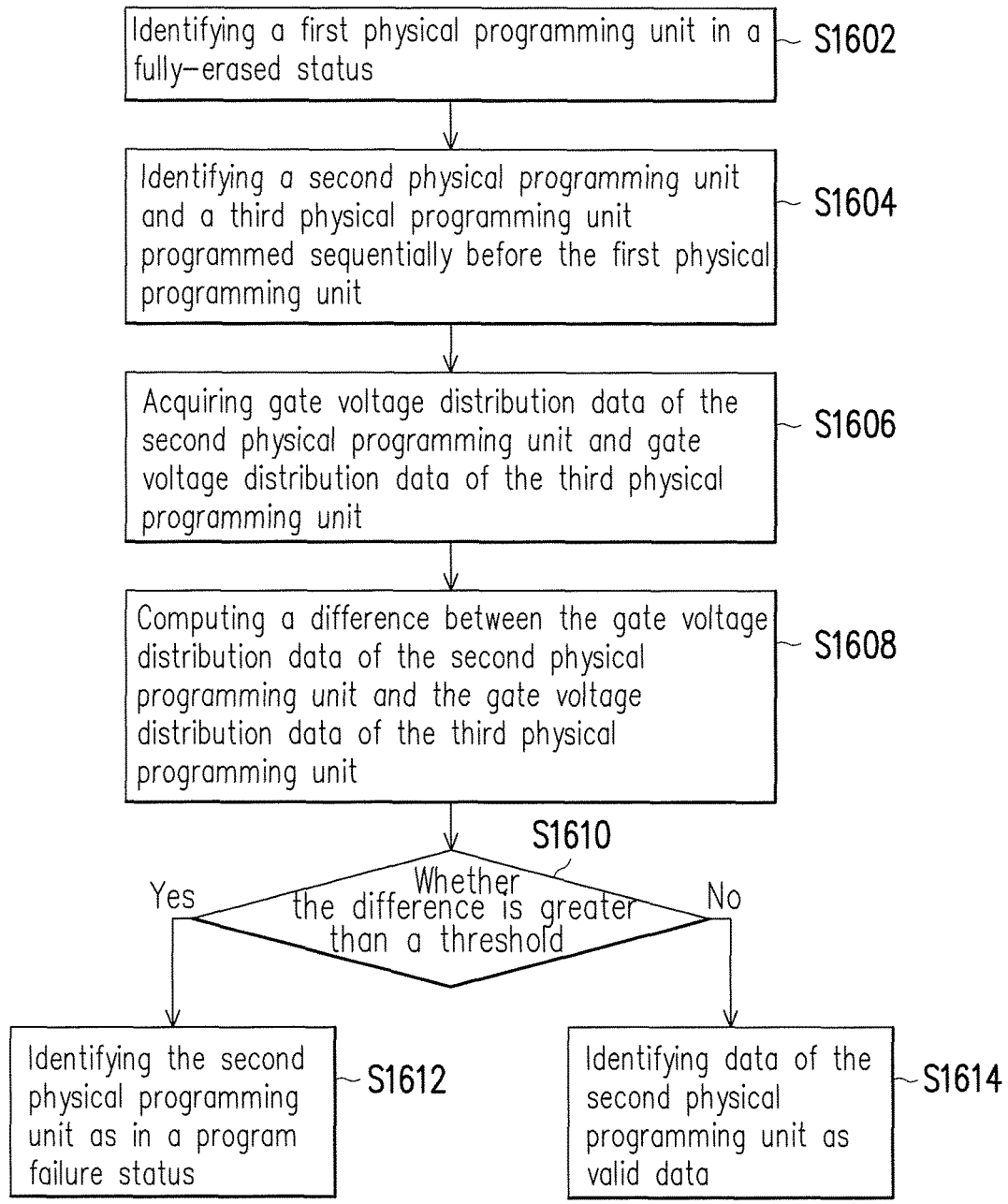
FIG. 16 is a flowchart illustrating a memory management method according to an exemplary embodiment.

FIG. 16 is a flowchart illustrating a memory management method according to an exemplary embodiment.

Referring to FIG. 16 and FIG. 12, it is assumed here that all the memory cells in a first physical programming unit 411(0) are in the fully-erased status (i.e., all bits in the first physical programming unit 411(0) are in the first storage status (e.g., "1")), and a third physical programming unit 415(0), a third physical programming unit 414(0), a third physical programming unit 413(0) and a second physical programming unit 412(0) are sequentially programmed.

In step S1602, when the memory storage apparatus 100 is powered on, the memory control circuit unit 104 (or the memory management circuit 202) identifies the first physical programming unit 411(0) by using the factory-default read voltage, wherein all bits in the first physical programming unit 411(0) are in the fully-erased status, and a previous physical programming unit (i.e., a second physical programming unit) of the first physical programming unit 411(0) is programmed (i.e., not in the fully-erased status).

Then, in step S1604, the memory control circuit unit 104 (or the memory management circuit 202) identifies the third physical programming unit 413(0) and the second physical programming unit 412(0) that are sequentially programmed before the first physical programming unit 411(0) and in step S1606, obtains threshold voltage distribution data of the memory cells respectively in the second physical programming unit 412(0) and the third physical programming unit 413(0).

In step S1608, the memory control circuit unit 104 (or the memory management circuit 202) compares the threshold voltage distribution data of the memory cells in the second physical programming unit 412(0) and the threshold voltage distribution data of the memory cells third physical programming unit 413(0) and computes a difference between the threshold voltage distribution data of the memory cells in the second physical programming unit 412(0) and the threshold voltage distribution data of the memory cells in the third physical programming unit 413(0). Then, in step S1610, the memory control circuit unit 104 (or the memory management circuit 202) determines whether the difference between the threshold voltage distribution data of the memory cells in the second physical programming unit 412(0) and the threshold voltage distribution data of the memory cells in the third physical programming unit 413(0) is greater than a threshold.

If the difference between the threshold voltage distribution data of the memory cells in the second physical programming unit 412(0) and the threshold voltage distribution data of the memory cells in the third physical programming unit 413(0) is greater than the threshold, in step S1612, the memory control circuit unit 104 (or the memory management circuit 202) identifies that the second physical programming unit 412(0) is in a program failure status. If the difference between the threshold voltage distribution data of the second physical programming unit 412(0) and the threshold voltage distribution data of the third physical programming unit 413(0) is not greater than the threshold, in step S1614, the memory control circuit unit 104 (or the memory management circuit 202) identifies the data of the second physical programming unit 412(0) as valid data.

Figure 17:
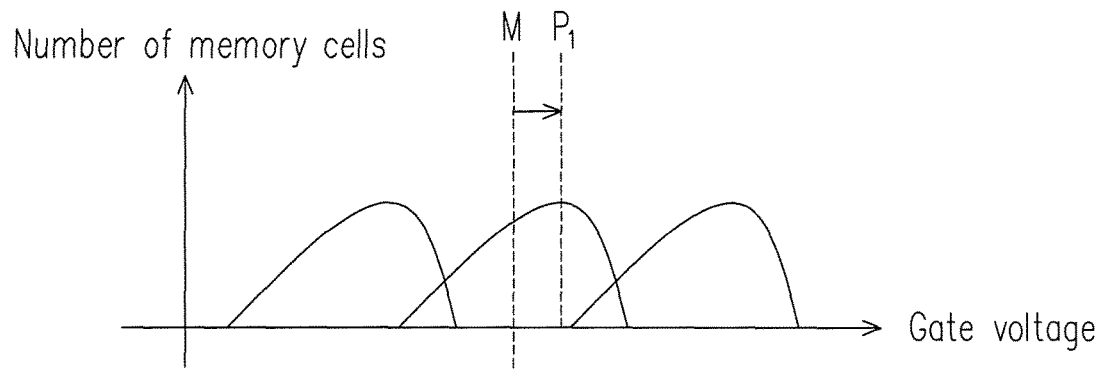
FIG. 17 and FIG. 18 illustrate the comparison of threshold voltage distribution data according to an exemplary embodiment.
Figure 17:
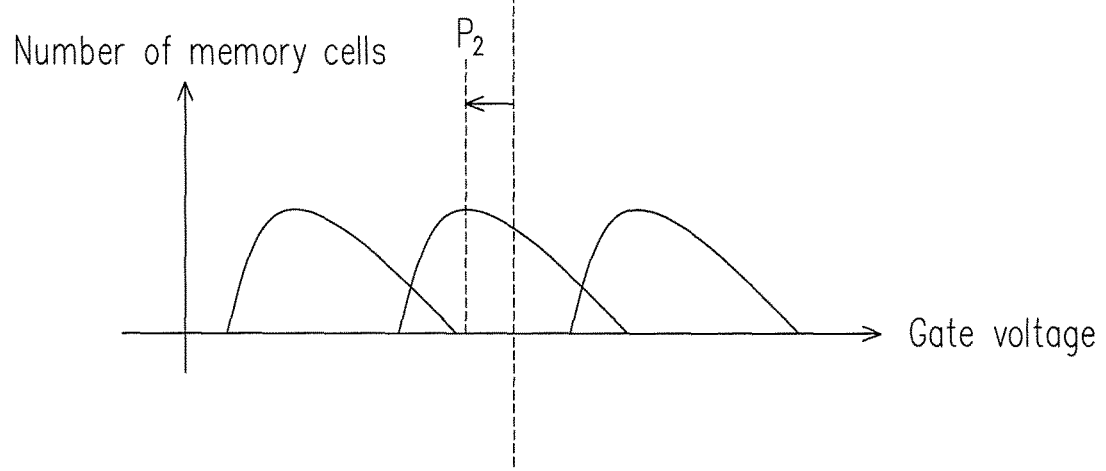
Figure 18:
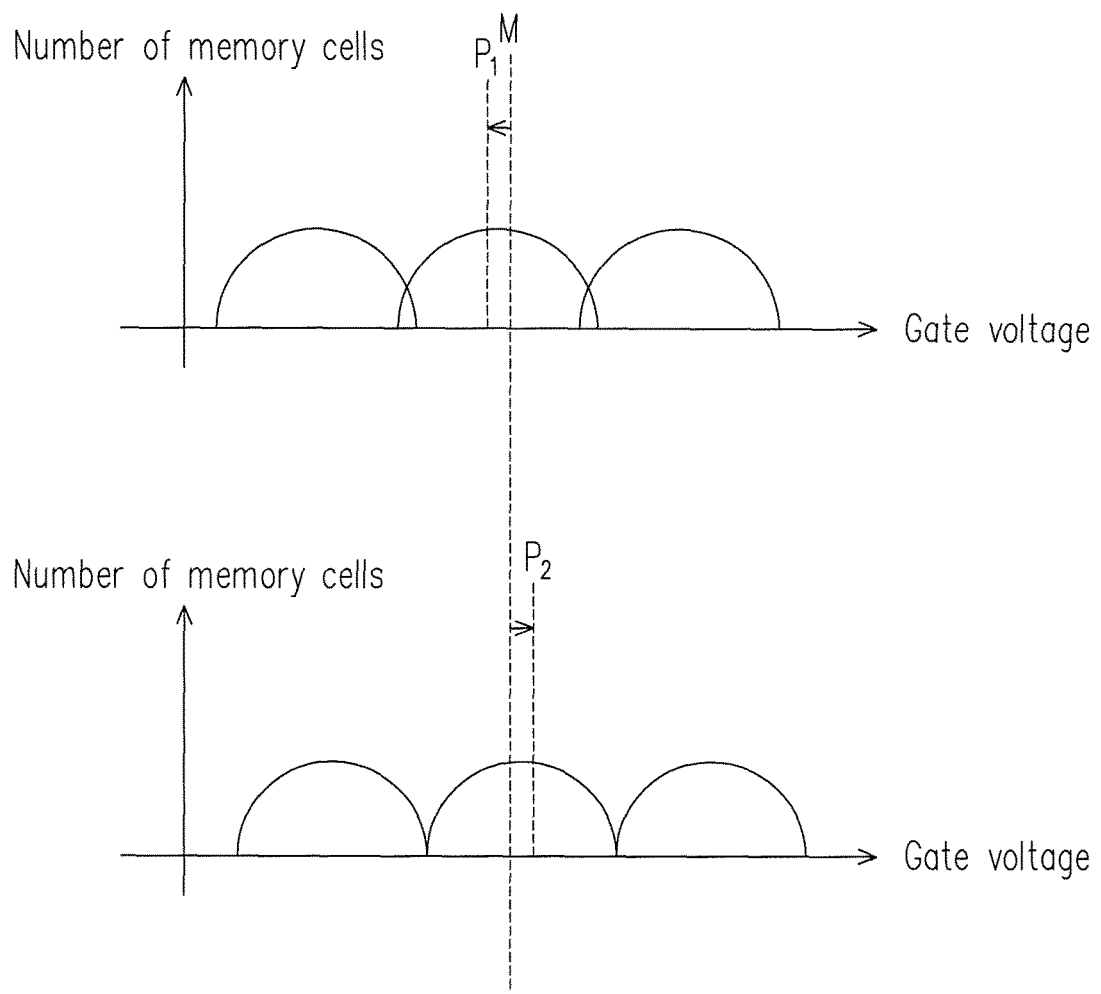

For instance, referring to FIG. 17, if the threshold voltage distribution data of the memory cells in the second physical programming unit 412(0) shifts rightward (which indicates that a threshold voltage of a peak P1 is higher than a threshold voltage reference value M for a predetermined value), while the threshold voltage distribution data of the memory cells in the third physical programming unit 413(0) shifts leftward (which indicates that a threshold voltage of a peak P2 is lower than the threshold voltage reference value M for another predetermined value), the difference between the threshold voltage distribution data of the second physical programming unit 412(0) and the threshold voltage distribution data of the third physical programming unit 413(0) is considered as being over the threshold. Furthermore, referring to FIG. 18, if the threshold voltage distribution data of the second physical programming unit 412(0) and the threshold voltage distribution data of the third physical programming unit 413(0) merely shift a little (which indicates that the difference between the threshold voltage of the peak P1 and the threshold voltage reference value M and between the threshold voltage of the peak P2 and the threshold voltage reference value M is not large), the difference between the threshold voltage distribution data of the second physical programming unit 412(0) and the threshold voltage distribution data of the third physical programming unit 413(0) is considered as being lower than the threshold.

It should be noted that the comparison between the threshold voltage distribution data of the memory cells in the second physical programming unit 412(0) and the threshold voltage distribution data of the memory cells in the third physical programming unit 413(0) has been described above, but the present invention is not limited thereto. In another exemplary embodiment, the memory control circuit unit 104 (or the memory management circuit 202) may also first calculate the threshold voltage distribution data of the memory cells in the two physical programming units (e.g., the third physical programming unit 413(0) and the third physical programming unit 414(0)) that are programmed before the second physical programming unit 412(0), obtain a mean of the threshold voltage distribution data of the memory cells in the third physical programming unit 413(0) and the third physical programming unit 414(0), and then compute a difference between the mean and the threshold voltage distribution data of the memory cells in the second physical programming unit 412(0). In yet another exemplary embodiment, the memory control circuit unit 104 (or the memory management circuit 202) may also calculate the threshold voltage distribution data of the memory cells in three (e.g., the third physical programming unit 413(0), the third physical programming unit 414(0) and the third physical programming unit 415(0)) or more physical programming units that are programmed before the second physical programming unit 412(0), obtain a mean of the threshold voltage distribution data of the memory cells in the physical programming units and then compute a difference between the mean and the threshold voltage distribution data of the memory cells in the second physical programming unit 412(0). In this case, taking the MLC NAND flash memory illustrated in FIG. 10 for example, the threshold voltage distribution data of the lower page is the first read voltage VA, and the threshold voltage distribution data of the upper page includes the first read voltage VA, the second read voltage VB and the third read voltage VC. Additionally, taking the TLC NAND flash memory illustrated in FIG. 11 for example, the threshold voltage distribution data of the lower page is the first read voltage VA, and the threshold voltage distribution data of the center page includes the first read voltage VA, the second read voltage VB and the third read voltage VC, and the threshold voltage distribution data of the upper page includes the first read voltage VA to the seventh read voltage VG.

It should be understood that even though in the exemplary embodiments, the memory control circuit unit 104 (or the memory management circuit 202) determines whether the program failure occurs by identifying the threshold voltage distribution data of the memory cells in each physical programming unit as the status data, the present invention is not limited thereto. For instance, in another exemplary embodiment, the memory control circuit unit 104 (or the memory management circuit 202) may also identify whether the program failure occurs, by using an updated read voltage of the memory cells in each physical programming unit as the status data.

Figure 19:
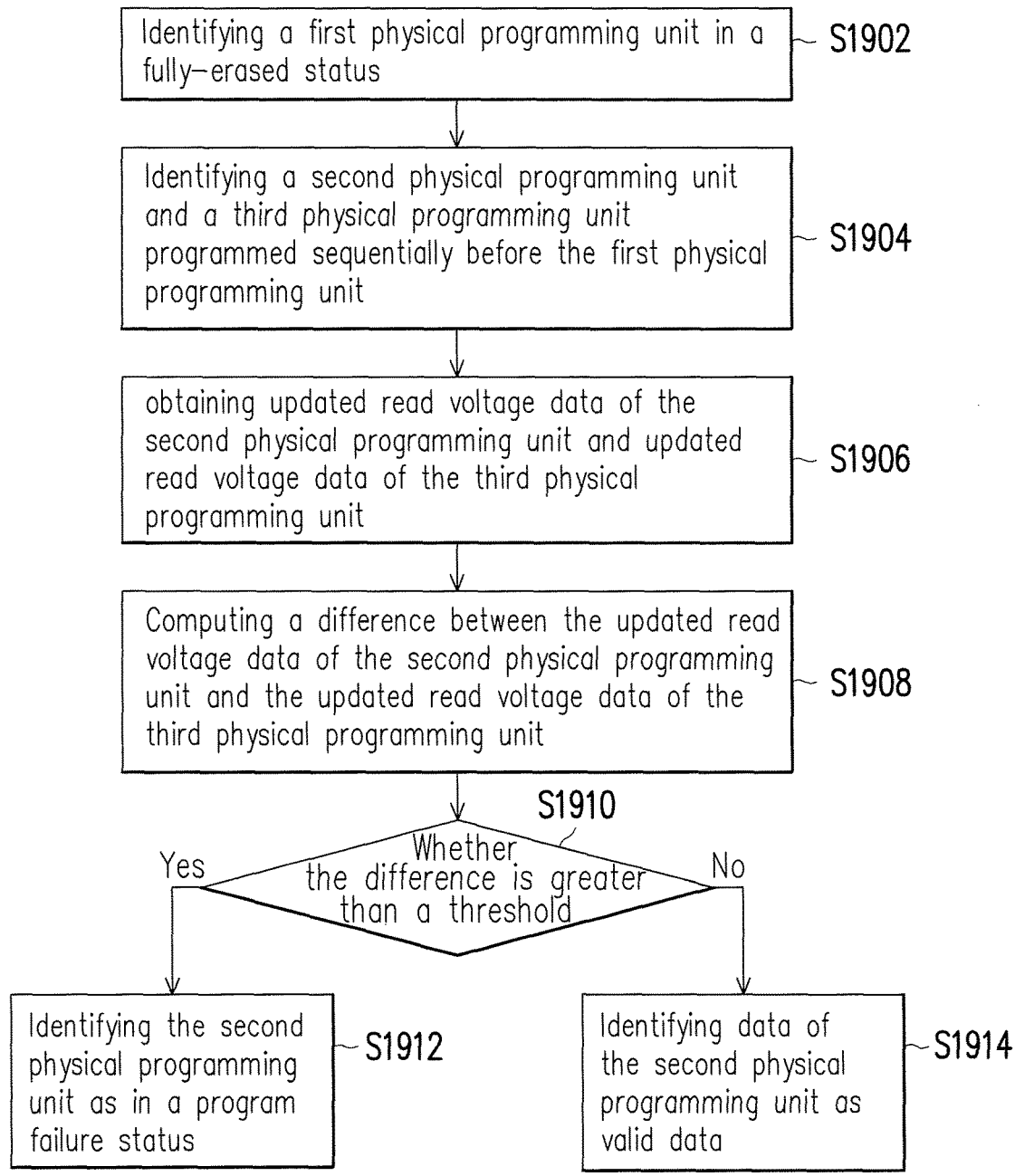
FIG. 19 is a flowchart illustrating a memory management method according to another exemplary embodiment.

FIG. 19 is a flowchart illustrating a memory management method according to another exemplary embodiment.

Referring to FIG. 19 and FIG. 12 together, in step S1902, the memory control circuit unit 104 (or the memory management circuit 202) identifies the first physical programming unit 411(0) according to a factory-default predetermined read voltage when the memory storage apparatus 100 is powered on, in which all the memory cells of the first physical programming unit 411(0) are in the fully-erased status, and a physical programming unit before the first physical programming unit 411(0) (which is the second physical programming unit) is programmed (i.e., not in the fully-erased status).

Then, in step S1904, the memory control circuit unit 104 (or the memory management circuit 202) identifies the third physical programming unit 413(0) and the second physical programming unit 412(0) that are sequentially programmed before the first physical programming unit 411(0) and in step S1906, obtains updated read voltage data applied to a word line of the second physical programming unit 412(0) and updated read voltage data applied to a word line of the third physical programming unit 413(0). For instance, during the process of obtaining the updated read voltage data, the memory control circuit unit 104 (or the memory management circuit 202) may apply an initial read voltage on the word lines, calculate the number in pages corresponding to the word lines by using the error checking and correcting circuit 208, adjust the initial read voltage and calculate the number of the error bits based on a predetermined algorithm until the number of the error bits in the pages corresponding to the word lines is smaller than an upper limit that error checking and correcting circuit 208 is able to correct in case the number of the error bits is greater than the upper limit. Then, the memory control circuit unit 104 (or the memory management circuit 202) may set the read voltage applied to the word lines at this time as the updated read voltages.

In step S1908, the memory control circuit unit 104 (or the memory management circuit 202) compares the updated read voltage data applied to the word line of the second physical programming unit 412(0) and the updated read voltage data applied to the word line of the third physical programming unit 413(0) and calculates the difference between the updated read voltage data respectively applied to the word lines of the second physical programming unit 412(0) and the third physical programming unit 413(0). Then, in step S1910, the memory control circuit unit 104 (or the memory management circuit 202) determines whether the difference between the updated read voltage data respectively applied to the word lines of the second physical programming unit 412(0) and the third physical programming unit 413(0) is greater than a threshold.

Figure 20:
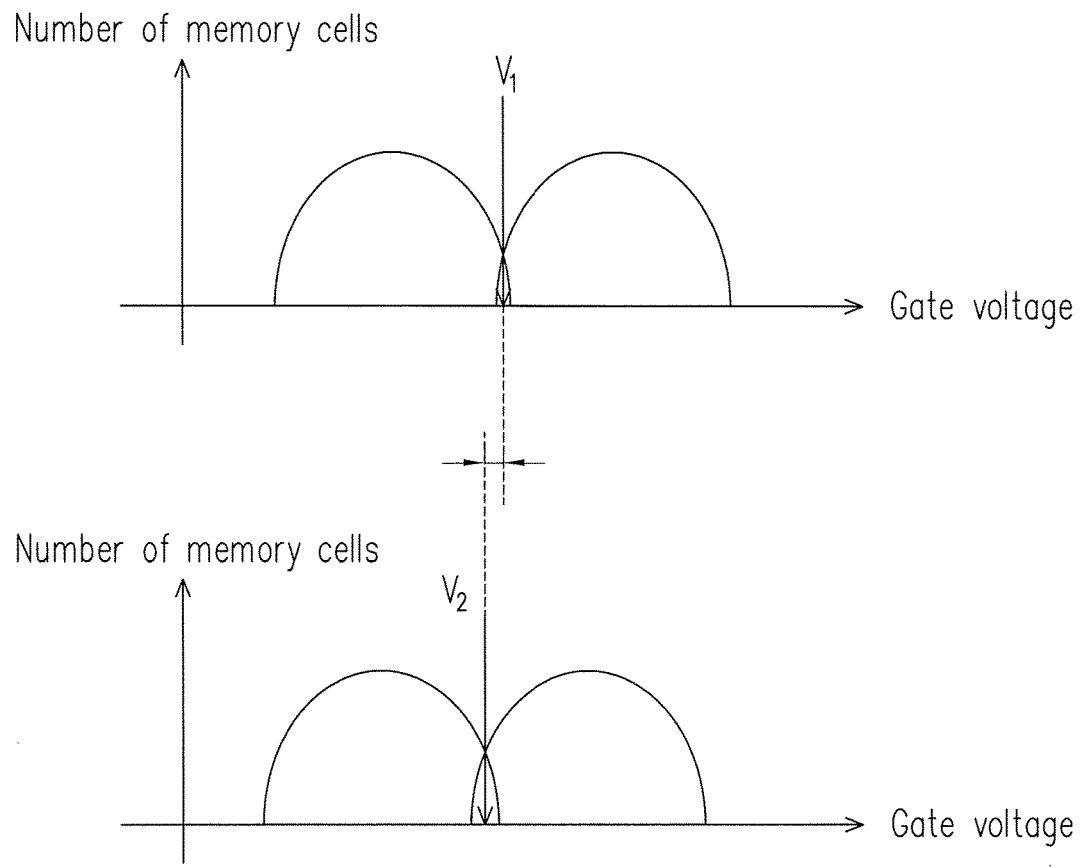
FIG. 20 illustrates the comparison of updated read voltage data according to an exemplary embodiment.

If the difference between the updated read voltage data respectively applied to the word lines of the second physical programming unit 412(0) and the third physical programming unit 413(0) is greater than the threshold, in step S1912, the memory control circuit unit 104 (or the memory management circuit 202) identifies the second physical programming unit 412(0) as in a program failure status. If the difference between the updated read voltage data (e.g., V1 as illustrated in FIG. 20) applied to the word line of the second physical programming unit 412(0) and the updated read voltage data (e.g., V2 as illustrated in FIG. 20) applied to the third physical programming unit 413(0) is smaller than the threshold, in step S1914, the memory control circuit unit 104 (or the memory management circuit 202) identifies the data of the second physical programming unit 412(0) as valid data.

It should be noted that even though the updated read voltage data applied to the word lines of the second physical programming unit 412(0) and the third physical programming unit 413(0) are compared above, the present invention is not limited thereto. In another exemplary embodiment, the memory control circuit unit 104 (or the memory management circuit 202) may also first calculate a mean of the updated read voltage data applied to the word lines of two physical programming units (e.g., the third physical programming unit 413(0) and the third physical programming unit 414(0)) that are programmed before the second physical programming unit 412(0) and compares the mean and the updated read voltage applied to the word line of the second physical programming unit 412(0). In yet another exemplary embodiment, the memory control circuit unit 104 (or the memory management circuit 202) may also first calculate a mean of the updated read voltage data applied to the word lines of three (e.g., the third physical programming unit 413(0), the third physical programming unit 414(0) and the third physical programming unit 415(0)) or more physical programming units that are programmed before the second physical programming unit 412(0) and compares the mean and the updated read voltage applied to the word line of the second physical programming unit 412(0).

In this case, taking the MLC NAND flash memory illustrated in FIG. 10 for example, the updated read voltage data of the lower page includes an updated read voltage corresponding to the first read voltage VA, and the updated read voltage data of the lower page includes updated read voltages corresponding to the first read voltage VA, the second read voltage VB and the third read voltage VC. Moreover, taking the TLC NAND flash memory illustrated in FIG. 11, the updated read voltage data of the lower page includes the updated read voltage corresponding to the first read voltage VA, the updated read voltage data of the center page includes the updated read voltages corresponding to the first read voltage VA, the second read voltage VB and the third read voltage VC, and the updated read voltage data of the upper page includes updated read voltages corresponding to the first read voltage VA to the seventh read voltage VG.

Additionally, the memory control circuit unit 104 (or the memory management circuit 202) may identify whether the program failure occurs not only by using the threshold voltage distribution data and the updated read voltage data as the status data, but also by using the number of the error bits in the data in the physical programming units as the status data in another exemplary embodiment.

Figure 21:
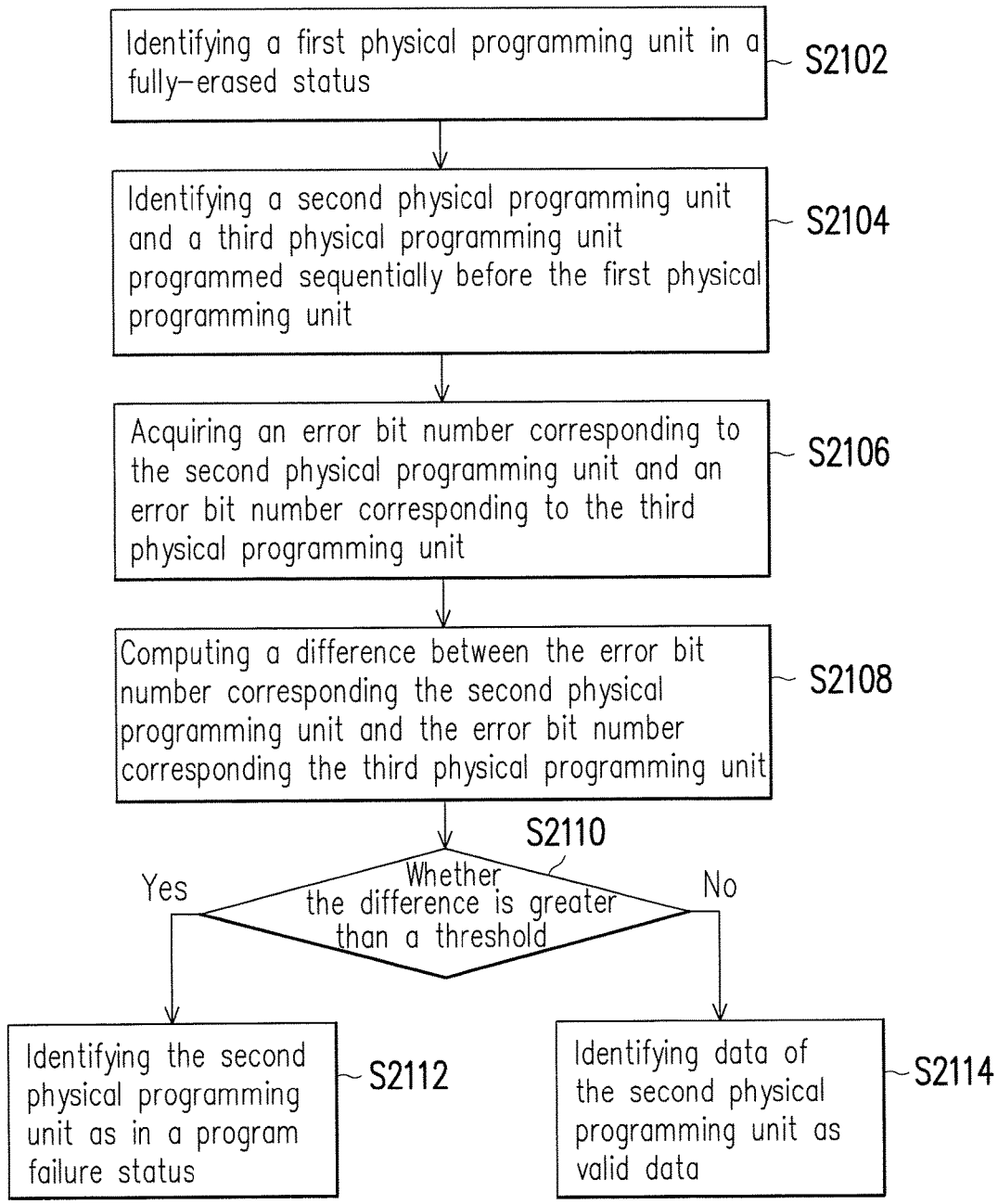
FIG. 21 is a flowchart illustrating a memory management method according to another exemplary embodiment.

FIG. 21 is a flowchart illustrating a memory management method according to another exemplary embodiment.

Referring to FIG. 21 and FIG. 12 together, in step S2102, when the memory storage apparatus 100 is powered on, the memory control circuit unit 104 (or the memory management circuit 202) identifies the first physical programming unit 411(0) by using a factory-default predetermined read voltage, in which all the memory cells of the first physical programming unit 411(0) are in the fully-erased status, and a physical programming unit (i.e., the second physical programming unit) before the first physical programming unit 411(0) is already programmed (i.e., not in the fully-erased status).

Then, in step S2104, the memory control circuit unit 104 (or the memory management circuit 202) identifies the third physical programming unit 413(0) and the second physical programming unit 412(0) that are sequentially programmed before the first physical programming unit 411(0) and in step S2106, obtains the numbers of the error bits (referred to as error bit numbers hereinafter) of the second physical programming unit 412(0) and the third physical programming unit 413(0).

In step S2108, the memory control circuit unit 104 (or the memory management circuit 202) computes a difference between the error bit number corresponding to the second physical programming unit 412(0) and the error bit number of the third physical programming unit 413(0). Then, in step S2110, the memory control circuit unit 104 (or the memory management circuit 202) determines whether the difference between the error bit number corresponding to the second physical programming unit 412(0) and the error bit number of the third physical programming unit 413(0) is greater than a threshold.

If the difference between the error bit number corresponding to the second physical programming unit 412(0) and the error bit number of the third physical programming unit 413(0) is greater than the threshold, in step S2112, the memory control circuit unit 104 (or the memory management circuit 202) identifies that the second physical programming unit 412(0) is in the program failure status. If the difference between the error bit number corresponding to the second physical programming unit 412(0) and the error bit number of the third physical programming unit 413(0) is smaller than the threshold, in step S2114, the memory control circuit unit 104 (or the memory management circuit 202) identifies the second physical programming unit 412(0) as valid data.

It should be noted that the error bit numbers in the data of the second physical programming unit 412(0) and the third physical programming unit 413(0) are compared in the exemplary embodiments above, but the present invention is not limited thereto. In another exemplary embodiment, the memory control circuit unit 104 (or the memory management circuit 202) may also calculate a mean of the error bit numbers of the data read from two physical programming units (e.g., the third physical programming unit 413(0) and the third physical programming unit 414(0)) that are programmed before the second physical programming unit 412(0) and compare the mean with the error bit number corresponding to the second physical programming unit 412(0). In yet another exemplary embodiment, the memory control circuit unit 104 (or the memory management circuit 202) calculate a mean of the error bit numbers of the data read from three (e.g., the third physical programming unit 413(0), the third physical programming unit 414(0) and the third physical programming unit 415(0)) or more physical programming units that are programmed before the second physical programming unit 412(0) and compare the mean with the error bit number corresponding to the second physical programming unit 412(0).

Furthermore, in addition to identifying whether the program failure occurs by using the threshold voltage distribution data, the updated read voltage data and the error bit numbers as the status data, in another exemplary embodiment, the memory control circuit unit 104 (or the memory management circuit 202) may also identify whether the program failure occurs by using the number of retry read times (referred to as a retry read number) as the status data.

Figure 22:
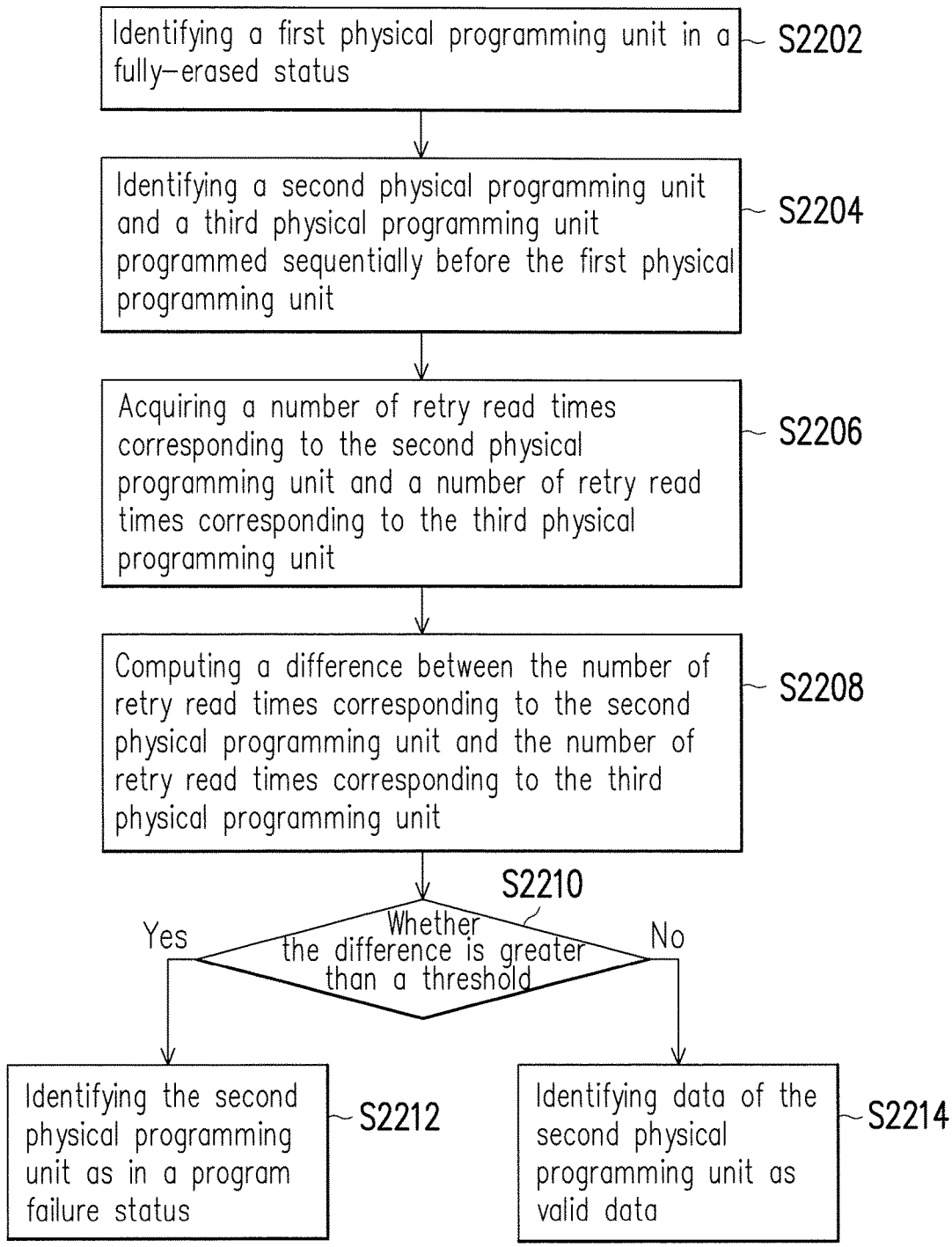
FIG. 22 is a flowchart illustrating a memory management method according to another exemplary embodiment.

FIG. 22 is a flowchart illustrating a memory management method according to another exemplary embodiment.

Referring to FIG. 22 and FIG. 12 together, in step S2202, when the memory storage apparatus 100 is powered on, the memory control circuit unit 104 (or the memory management circuit 202) identifies the first physical programming unit 411(0) by using the factory-default read voltage, wherein all bits in the first physical programming unit 411(0) are in the fully-erased status, and a physical programming units (i.e., the second physical programming unit) before the first physical programming unit 411(0) is programmed (i.e., not in the fully-erased status).

Then, in step S2204, the memory control circuit unit 104 (or the memory management circuit 202) identifies the third physical programming unit 413(0) and the second physical programming unit 412(0) that are sequentially programmed before the first physical programming unit 411(0) and in step S2206, obtains retry read numbers corresponding to the second physical programming unit 412(0) and the third physical programming unit 413(0).

Figure 23:
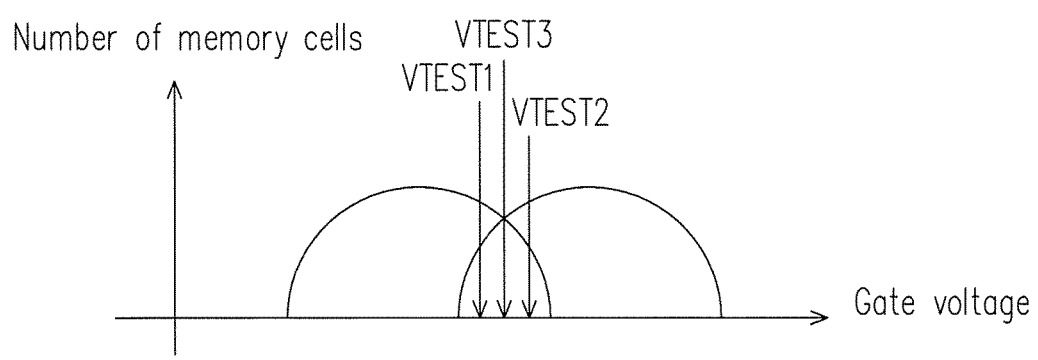
FIG. 23 is a schematic diagram of verifying the updated read voltages of the physical programming units according to an exemplary embodiment.

FIG. 23 is a schematic diagram of verifying the updated read voltages of the physical programming units according to an exemplary embodiment. Referring to FIG. 23, the memory control circuit unit 104 (or the memory management circuit 202) applies a first testing read voltage VTEST1 adjusted based on the first read voltage VA to read the data in a physical programming unit and calculates the number of error bits in the data read by using the first testing read voltage VTEST1 in the physical programming unit according to testing data. If the number of error bits in the data read by using the first testing read voltage VTEST1 in the physical programming unit is uncorrectable, i.e., the number of the error bits in the data of the physical programming unit is greater than the number of the error bits that is correctable through the ECC code, the memory control circuit unit 104 (or the memory management circuit 202) applies a second testing read voltage VTEST2 to read the data and determines again whether the read data is correctable. If the data read by using the second testing read voltage VTEST2 is still uncorrectable, the memory control circuit unit 104 (or the memory management circuit 202) applies a third testing read voltage VTEST3 to read the data, and so on, until errors in the read data is correctable, or the number of retry read times is over a predetermined value. Herein, the number of retry read times refers to the number of times that the memory control circuit unit 104 (or the memory management circuit 202) applies the testing read voltages to read the data.

Referring to FIG. 22 again, in step S2208, the memory control circuit unit 104 (or the memory management circuit 202) compares the numbers of retry read times corresponding to the second physical programming unit 412(0) and the third physical programming unit 413(0) and computes a difference between the numbers of retry read times corresponding to the second physical programming unit 412(0) and the third physical programming unit 413(0). Then, in step S2210, the memory control circuit unit 104 (or the memory management circuit 202) determines whether the difference between the numbers of retry read times corresponding to the second physical programming unit 412(0) and the third physical programming unit 413(0) is greater than a threshold.

If the difference between the numbers of retry read times corresponding to the second physical programming unit 412(0) and the third physical programming unit 413(0) is greater than the threshold, in step S2212, the memory control circuit unit 104 (or the memory management circuit 202) identifies that the second physical programming unit 412(0) is in the program failure status. If the difference between the numbers of retry read times corresponding to the second physical programming unit 412(0) and the third physical programming unit 413(0) is smaller than the threshold, in step S2214, the memory control circuit unit 104 (or the memory management circuit 202) identifies the data of the second physical programming unit 412(0) as valid data.

It should be noted that the embodiment above is described as comparing the numbers of retry read times corresponding to the second physical programming unit 412(0) and the third physical programming unit 413(0), but the present invention is not limited thereto. In another exemplary embodiment, the memory control circuit unit 104 (or the memory management circuit 202) may also first calculate a mean of numbers of retry read times corresponding to two physical programming units (e.g., the third physical programming unit 413(0) and the third physical programming unit 414(0)) that are programmed before the second physical programming unit 412(0) and compare the mean and the number of retry read times corresponding to the second physical programming unit 412(0). In yet another exemplary embodiment, the memory control circuit unit 104 (or the memory management circuit 202) may also first calculate a mean of numbers of retry read times corresponding to three (e.g., the third physical programming unit 413(0), the third physical programming unit 414(0) and the third physical programming unit 415(0)) or more physical programming units that are programmed before the second physical programming unit 412(0) and compare the mean and the number of retry read times corresponding to the second physical programming unit 412(0).

To summarize, in the memory management method, the memory control circuit unit and the memory storage apparatus using the method provided by the present invention, when the memory storage apparatus is powered on, the fully-erased physical programming unit and a plurality of pages that are programmed before the physical programming unit are identified, and the status data, including the threshold voltage distribution data, the updated read voltage data, the error bit numbers or the numbers of retry read times corresponding to the pages are compared, such that whether the last programmed physical programming unit among the physical programming units is the page being programmed when the abnormal power failure occurs is determined. Since the status data in the physical programming unit being programmed when the abnormal power failure occurs has greater difference from other pages, if the status data of the last programmed physical programming unit have great difference from the status data of other pages, it can be determined that the physical programming unit is being programmed when the abnormal power failure occurs, and the physical programming unit is identified as in the program failure status. Through the memory management method of the present invention, the errors occurring when the memory storage apparatus is accessed due to the memory management circuit arbitrarily determining the valid data of a page whose error bit number is over the predetermined value as the valid data can be avoided. The previously described exemplary embodiments of the present invention have the advantages aforementioned, wherein the advantages aforementioned not required in all versions of the exemplary embodiments of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory management method for a rewritable non-volatile memory module, the rewritable non-volatile memory module having a plurality of physical programming units, and each of the physical programming units having a plurality of bits, the memory management method comprising:
   identifying a first physical programming unit among the physical programming units by applying a predetermined read voltage, wherein the first physical programming unit is identified as in a fully-erased status;
   identifying a second physical programming unit and at least one third physical programming unit, wherein the second physical programming unit is programmed before the first physical programming unit, and the at least one third physical programming unit is programmed before the second physical programming unit;
   acquiring status data of the second physical programming unit and at least one status data of the at least one third physical programming unit;
   computing a difference between the status data of the second physical programming unit and the at least one status data of the at least one third physical programming unit; and
   if the difference is greater than a threshold, identifying the second physical programming unit as in a program failure status.

2. The memory management method according to claim 1, wherein when each bit of the first physical programming unit is in a first storage status, the first physical programming unit is identified as in the fully-erased status.

3. The memory management method according to claim 1, further comprising:
   if the difference is not greater than the threshold, and an error bit number corresponding to the second physical programming unit is greater than an error bit threshold, correcting error bits in the second physical programming unit through an error checking and correction (ECC) code.

4. The memory management method according to claim 1, wherein the at least one third physical programming unit is a plurality of third physical programming units, and
   the step of computing the difference between the status data of the second physical programming unit and the at least one status data of the at least one third physical programming units comprises:
   calculating a mean of the status data of the plurality of third physical programming units and calculating a difference between the status data of the second physical programming unit and the mean as the difference.

5. The memory management method according to claim 1, wherein the status data of the second physical programming unit is threshold voltage distribution data of memory cells of the second physical programming unit, and the at least one status data of the at least one third physical programming unit is at least one threshold voltage distribution data of memory cells of the at least one third physical programming unit.

6. The memory management method according to claim 1, wherein the status data of the second physical programming unit is an updated read voltage data applied to a word line of the second physical programming unit, and the at least one status data of the at least one third physical programming unit is at least one updated read voltage data applied to a word line of the at least one third physical programming unit.

7. The memory management method according to claim 1, wherein the status data of the second physical programming unit is the number of error bits in data read from the second physical programming unit, and the at least one status data of the at least one third physical programming unit is the number of error bits in data read from the at least one third physical programming unit.

8. The memory management method according to claim 1, wherein the status data of the second physical programming unit is the number of retry read times required for reading correctable data from the second physical programming unit, and the at least one status data of the at least one third physical programming unit is the number of retry read times required for reading correctable data read from the at least one third physical programming unit.

9. A memory control circuit unit for accessing a rewritable non-volatile memory module comprising:
   a host interface configured to couple to a host system;
   a memory interface configured to couple to the rewritable non-volatile memory module, wherein the rewritable non-volatile memory module has a plurality of physical programming units, and each of the physical programming units comprises a plurality of bits; and
   a memory management circuit coupled to the host interface and the memory interface, wherein the memory management circuit identifies a first physical programming unit among the physical programming units by applying a predetermined read voltage, wherein the first physical programming unit is identified as in a fully-erased status;

wherein the memory management circuit identifies a second physical programming unit and at least one third physical programming unit, wherein the second physical programming unit is programmed before the first physical programming unit, and the at least one third physical programming unit is programmed before the second physical programming unit;

wherein the memory management circuit acquires status data of the second physical programming unit and at least one status data of the at least one third physical programming unit;

wherein the memory management circuit computes a difference between the status data of the second physical programming unit and the at least one status data of the at least one third physical programming unit; and wherein if the difference is greater than a threshold, the memory management circuit identifies the second physical programming unit as in a program failure status.

10. The memory control circuit unit according to claim 9, wherein when each bit of the first physical programming unit is in a first storage status, the first physical programming unit is identified as in the fully-erased status.

11. The memory control circuit unit according to claim 9, wherein if the difference is not greater than the threshold, and an error bit number corresponding to the second physical programming unit is greater than an error bit threshold, the memory management circuit corrects error bits in the second physical programming unit through an ECC code.

12. The memory control circuit unit according to claim 9, wherein the at least one third physical programming unit is a plurality of third physical programming units, and the memory management circuit calculates a mean of the status data of the plurality of third physical programming units and computes a difference between the status data of the second physical programming unit and the mean as the difference.

13. The memory control circuit unit according to claim 9, wherein the status data of the second physical programming unit is threshold voltage distribution data of memory cells of the second physical programming unit, and the at least one status data of the at least one third physical programming unit is at least one threshold voltage distribution data of memory cells of the at least one third physical programming unit.

14. The memory control circuit unit according to claim 9, wherein the status data of the second physical programming unit is an updated read voltage data applied to a word line of the second physical programming unit by the memory management circuit, and the at least one status data of the at least one third physical programming unit is at least one updated read voltage data applied to a word line of the at least one third physical programming unit by the memory management circuit.

15. The memory control circuit unit according to claim 9, wherein the status data of the second physical programming unit is the number of error bits in data read from the second physical programming unit by the memory management circuit, and the at least one status data of the at least one third physical programming unit is the number of error bits in data read from the at least one third physical programming unit by the memory management circuit.

16. The memory control circuit unit according to claim 9, wherein the status data of the second physical programming unit is the number of retry read times required for reading correctable data from the second physical programming unit by the memory management circuit, and the at least one status data of the at least one third physical programming unit is the number of retry read times required for reading correctable data from the at least one third physical programming unit by the memory management circuit.

17. A memory storage apparatus, comprising:

a connection interface unit configured to couple to a host system;

a rewritable non-volatile memory module having a plurality of physical programming units, and each of the physical programming units comprising a plurality of bits; and a memory control circuit unit coupled to the connection interface unit and the rewritable non-volatile memory module, wherein the memory control circuit unit identifies a first physical programming unit among the physical programming units by applying a predetermined read voltage, wherein the first physical programming unit is identified as in a fully-erased status;

wherein the memory control circuit unit identifies a second physical programming unit and at least one third physical programming unit, wherein the second physical programming unit is programmed before the first physical programming unit, and the at least one third physical programming unit is programmed before the second physical programming unit;

wherein the memory control circuit unit acquires status data of the second physical programming unit and at least one status data of the at least one third physical programming unit;

wherein the memory control circuit unit computes a difference between the status data of the second physical programming unit and the at least one status data of the at least one third physical programming unit; and wherein if the difference is greater than a threshold, the memory control circuit unit identifies the second physical programming unit as in a program failure status.

18. The memory storage apparatus according to claim 17, wherein when each bit of the first physical programming unit is in a first storage status, the first physical programming unit is identified as in the fully-erased status.

19. The memory storage apparatus according to claim 17, wherein if the difference is not greater than the threshold, and an error bit number corresponding to the second physical programming unit is greater than an error bit threshold, the memory control circuit unit corrects error bits in the second physical programming unit through an ECC code.

20. The memory storage apparatus according to claim 17, wherein the at least one third physical programming unit is a plurality of third physical programming units, and the memory control circuit unit calculates a mean of the status data of the plurality of third physical programming units and computes a difference between the status data of the second physical programming unit and the mean as the difference.

21. The memory storage apparatus according to claim 17, wherein the status data of the second physical programming unit is threshold voltage distribution data of memory cells of the second physical programming unit, and the at least one status data of the at least one third physical programming unit is at least one threshold voltage distribution data of memory cells of the at least one third physical programming unit.

22. The memory storage apparatus according to claim 17, wherein the status data of the second physical programming unit is an updated read voltage data applied to a word line of the second physical programming unit by the memory control circuit unit, and the at least one status data of the at least one third physical programming unit is at least one updated read voltage data applied to a word line of the at least one third physical programming unit by the memory control circuit unit.

23. The memory storage apparatus according to claim 17, wherein the status data of the second physical programming unit is the number of error bits in data read from the second physical programming unit by the memory control circuit unit, and the at least one status data of the at least one third physical programming unit is the number of error bits in data read from the at least one third physical programming unit by the memory control circuit unit.

24. The memory storage apparatus according to claim 17, wherein the status data of the second physical programming unit is the number of retry read times required for reading correctable data from the second physical programming unit by the memory control circuit unit, and the at least one status data of the at least one third physical programming unit is the number of retry read times for reading correctable data from the at least one third physical programming unit by the memory control circuit unit.

* * * * *